(12) United States Patent
Edwards et al.

(10) Patent No.: US 8,334,464 B2
(45) Date of Patent: Dec. 18, 2012

(54) OPTIMIZED MULTI-LAYER PRINTING OF ELECTRONICS AND DISPLAYS

(75) Inventors: Chuck Edwards, Rio Rancho, NM (US); James John Howarth, Albuquerque, NM (US); Karel Vanheusden, Placitas, NM (US)

(73) Assignee: Cabot Corporation, Boston, MA (US)

( * ) Notice: Subject to any disclaimer, the term of this patent is extended or adjusted under 35 U.S.C. 154(b) by 1443 days.

(21) Appl. No.: 11/331,187

(22) Filed: Jan. 13, 2006

(65) Prior Publication Data
US 2006/0159899 A1 Jul. 20, 2006

Related U.S. Application Data

(60) Provisional application No. 60/695,415, filed on Jul. 1, 2005, provisional application No. 60/643,629, filed on Jan. 14, 2005, provisional application No. 60/643,577, filed on Jan. 14, 2005, provisional application No. 60/643,578, filed on Jan. 14, 2005.

(51) Int. Cl.
*H05K 1/16* (2006.01)

(52) U.S. Cl. ........................ 174/260; 174/261

(58) Field of Classification Search ............... 174/250, 174/260–262; 428/195.1, 901, 209–210
See application file for complete search history.

(56) References Cited

U.S. PATENT DOCUMENTS

| | | |
|---|---|---|
| 2,785,964 A | 3/1957 | Pollock |
| 3,313,632 A | 4/1967 | Langley et al. ........... 106/1 |
| 3,401,020 A | 9/1968 | Kester et al. |
| 3,683,382 A | 8/1972 | Ballinger ............... 346/74 |
| 3,814,696 A | 6/1974 | Verdone et al. ......... 252/317 |
| 3,922,355 A | 11/1975 | Kotthoff |
| 3,922,388 A | 11/1975 | Schebalin |
| 3,957,694 A | 5/1976 | Bolon et al. |
| RE28,972 E | 9/1976 | Weber et al. |
| 4,019,188 A | 4/1977 | Hochberg et al. ........ 346/75 |
| 4,051,074 A | 9/1977 | Asada |
| 4,105,483 A | 8/1978 | Lin ....................... 156/154 |
| 4,122,062 A | 10/1978 | Monte et al. ........... 260/42.14 |
| 4,130,671 A | 12/1978 | Nagesh et al. ......... 427/125 |

(Continued)

FOREIGN PATENT DOCUMENTS
EP 0 410 765 A3 7/1990
(Continued)

OTHER PUBLICATIONS

Advanced Materials Systems for Ultra-Low-Temperature, Digital, Direct-Write Technologies, Digital, Direct Write Technologies, Vanheusden, et al., "Direct-Write Technologies for Rapid Prototyping Applications", pp. 123-173 (2001).

(Continued)

*Primary Examiner* — Hung S Bui

(57) ABSTRACT

An apparatus and method for making a printed circuit board comprising a substrate and an electrical circuit is provided. The circuit is formed by deposition of a plurality of electronic inks onto the substrate and curing of each of the electronic inks. The deposition may be performed using an ink-jet printing process. The inkjet printing process may include the step of printing a plurality of layers, wherein a first layer includes at least one electronic ink deposited directly onto the substrate, and wherein each subsequent layer includes at least one electronic ink deposited on top of at least a portion of a previous layer when the previous layer has been cured. One or more of the layers may include at least two of the electronic inks.

26 Claims, 3 Drawing Sheets

U.S. PATENT DOCUMENTS

| | | | | |
|---|---|---|---|---|
| 4,170,480 | A | 10/1979 | Ikenoue et al. | 96/114.1 |
| 4,186,244 | A | 1/1980 | Deffeyes et al. | 428/570 |
| 4,211,668 | A | 7/1980 | Tate | 252/316 |
| 4,255,291 | A | 3/1981 | Needes et al. | 252/578 |
| 4,266,229 | A | 5/1981 | Mansukhani | 346/1.1 |
| 4,289,534 | A | 9/1981 | Deffeyes et al. | 106/1.14 |
| 4,333,966 | A | 6/1982 | Deffeyes et al. | 427/96 |
| 4,370,308 | A | 1/1983 | Williams et al. | |
| 4,381,945 | A | 5/1983 | Nair | 106/1.14 |
| 4,388,346 | A | 6/1983 | Beggs et al. | |
| 4,407,674 | A | 10/1983 | Ehrreich | 75/251 |
| 4,416,932 | A | 11/1983 | Nair | 428/209 |
| 4,418,099 | A | 11/1983 | Cuevas et al. | 427/229 |
| 4,419,383 | A | 12/1983 | Lee | 427/47 |
| 4,463,030 | A | 7/1984 | Deffeyes et al. | 427/216 |
| 4,487,811 | A | 12/1984 | Eichelberger et al. | 428/546 |
| 4,508,753 | A | 4/1985 | Stepan | 427/53.1 |
| 4,517,252 | A | 5/1985 | Hugh | 428/553 |
| 4,539,041 | A | 9/1985 | Figlarz et al. | 75/0.5 |
| 4,548,879 | A | 10/1985 | St. John et al. | 427/96 |
| 4,594,311 | A | 6/1986 | Frisch et al. | |
| 4,599,277 | A | 7/1986 | Brownlow et al. | 428/552 |
| 4,622,069 | A | 11/1986 | Akai et al. | 106/1.11 |
| 4,627,875 | A | 12/1986 | Kobayashi et al. | 106/22 |
| 4,650,108 | A | 3/1987 | Gallagher | 228/124 |
| 4,668,533 | A | 5/1987 | Miller | 427/98 |
| 4,697,041 | A | 9/1987 | Okaniwa et al. | |
| 4,720,418 | A | 1/1988 | Kuo | |
| 4,746,838 | A | 5/1988 | Kay | |
| 4,753,821 | A | 6/1988 | Giesecke et al. | 427/98 |
| 4,775,439 | A | 10/1988 | Seeger, Jr. et al. | 156/231 |
| 4,808,274 | A | 2/1989 | Nguyen | 204/15 |
| 4,857,241 | A | 8/1989 | Straw et al. | 261/152 |
| 4,859,241 | A | 8/1989 | Grundy | 106/114 |
| 4,877,451 | A | 10/1989 | Winnik et al. | 106/23 |
| 4,877,647 | A | 10/1989 | Klabunde | 427/123 |
| 4,879,104 | A | 11/1989 | List et al. | |
| 4,891,242 | A | 1/1990 | Ito et al. | 437/53.1 |
| 4,892,798 | A | 1/1990 | Lamanna et al. | 430/38 |
| 4,931,168 | A | 6/1990 | Watanabe et al. | 204/284 |
| 4,931,323 | A | 6/1990 | Manitt et al. | 427/53.1 |
| 4,948,623 | A | 8/1990 | Beach et al. | 427/35 |
| 4,959,430 | A | 9/1990 | Jonas et al. | 526/257 |
| 5,011,627 | A | 4/1991 | Lutz et al. | |
| 5,028,473 | A | 7/1991 | Vitriol et al. | 428/137 |
| 5,039,552 | A | 8/1991 | Riemer | 427/96 |
| 5,045,141 | A | 9/1991 | Salensky et al. | 156/240 |
| 5,049,434 | A | 9/1991 | Wasulko | 428/202 |
| 5,057,363 | A | 10/1991 | Nakanishi | 428/321.5 |
| 5,059,242 | A | 10/1991 | Firmstone et al. | 106/1.23 |
| 5,075,262 | A | 12/1991 | Nguyen et al. | 501/19 |
| 5,091,003 | A | 2/1992 | Boaz | 106/20 |
| 5,121,127 | A | 6/1992 | Toriyama | 343/700 |
| 5,132,248 | A | 7/1992 | Drummond et al. | 437/173 |
| 5,139,818 | A | 8/1992 | Mance | 427/54.1 |
| 5,148,355 | A | 9/1992 | Lowe et al. | |
| 5,153,023 | A | 10/1992 | Orlowski et al. | 427/555 |
| 5,160,366 | A | 11/1992 | Shibata | 75/232 |
| 5,173,330 | A | 12/1992 | Asano et al. | 427/558 |
| 5,176,744 | A | 1/1993 | Muller | 106/1.26 |
| 5,176,764 | A | 1/1993 | Abbott et al. | 152/158 |
| 5,183,784 | A | 2/1993 | Nguyen et al. | 501/19 |
| 5,215,593 | A | 6/1993 | Hosokawa et al. | 428/403 |
| 5,216,207 | A | 6/1993 | Prabhu et al. | 174/256 |
| 5,244,538 | A | 9/1993 | Kumar | 156/643 |
| 5,250,229 | A | 10/1993 | Hara et al. | 252/518 |
| 5,270,368 | A | 12/1993 | Lent et al. | 524/236 |
| 5,281,261 | A | 1/1994 | Lin | |
| 5,312,480 | A | 5/1994 | Lotze et al. | 106/1.13 |
| 5,312,674 | A | 5/1994 | Haertling et al. | 428/210 |
| 5,329,293 | A | 7/1994 | Liker | 347/11 |
| 5,332,646 | A | 7/1994 | Wright et al. | 430/137 |
| 5,366,760 | A | 11/1994 | Fujii et al. | 427/96 |
| 5,378,408 | A | 1/1995 | Carroll et al. | 252/514 |
| 5,378,508 | A | 1/1995 | Castro et al. | 427/556 |
| 5,384,953 | A | 1/1995 | Economikos et al. | 29/846 |
| 5,395,452 | A | 3/1995 | Kobayashi et al. | 118/715 |
| 5,403,375 | A | 4/1995 | Konig et al. | 75/255 |
| 5,421,926 | A | 6/1995 | Yukinobu et al. | 156/83 |
| 5,433,893 | A | 7/1995 | Jost et al. | 252/514 |
| 5,444,453 | A | 8/1995 | Lalezari | 343/700 |
| 5,463,057 | A | 10/1995 | Graetzel et al. | 546/4 |
| 5,494,550 | A | 2/1996 | Benge | 156/268 |
| 5,501,150 | A | 3/1996 | Leenders et al. | 101/466 |
| 5,529,937 | A * | 6/1996 | Zhang et al. | 438/471 |
| 5,539,041 | A | 7/1996 | Arnold et al. | 524/494 |
| 5,559,057 | A | 9/1996 | Goldstein | 437/228 |
| 5,565,143 | A | 10/1996 | Chan | 252/514 |
| 5,569,610 | A * | 10/1996 | Zhang et al. | 438/166 |
| 5,571,311 | A | 11/1996 | Belmont et al. | |
| 5,587,111 | A | 12/1996 | Watanabe et al. | 252/514 |
| 5,599,046 | A | 2/1997 | Behm et al. | 283/83 |
| 5,601,638 | A | 2/1997 | Fukuda et al. | 106/19 |
| 5,604,027 | A | 2/1997 | Sheridon | 428/323 |
| 5,604,673 | A | 2/1997 | Washburn et al. | 363/147 |
| 5,645,932 | A | 7/1997 | Uchibori | 428/347 |
| 5,665,472 | A | 9/1997 | Tanaka et al. | 428/402 |
| 5,679,724 | A | 10/1997 | Sacripante et al. | 523/161 |
| 5,712,673 | A | 1/1998 | Hayashi et al. | 347/217 |
| 5,716,663 | A | 2/1998 | Capote et al. | 427/96 |
| 5,725,647 | A | 3/1998 | Carlson et al. | 106/31.86 |
| 5,725,672 | A | 3/1998 | Schmitt et al. | 118/715 |
| 5,746,868 | A | 5/1998 | Abe | 156/247 |
| 5,747,222 | A | 5/1998 | Ryu | 430/312 |
| 5,747,562 | A | 5/1998 | Mahmud et al. | |
| 5,750,194 | A | 5/1998 | Watanabe et al. | 427/216 |
| 5,751,325 | A | 5/1998 | Leenders et al. | 347/96 |
| 5,759,230 | A | 6/1998 | Chow et al. | |
| 5,759,712 | A | 6/1998 | Hockaday | 429/30 |
| 5,767,810 | A | 6/1998 | Hagiwara et al. | 343/700 |
| 5,781,158 | A | 7/1998 | Ko et al. | 343/700 |
| 5,801,108 | A | 9/1998 | Huang et al. | 501/32 |
| 5,814,683 | A | 9/1998 | Branham | |
| 5,826,329 | A | 10/1998 | Roth | 29/846 |
| 5,828,271 | A | 10/1998 | Stitzer | 333/24.1 |
| 5,837,041 | A | 11/1998 | Bean et al. | 106/31.6 |
| 5,837,045 | A | 11/1998 | Johnson et al. | 106/31.85 |
| 5,838,271 | A | 11/1998 | Park | 341/144 |
| 5,838,567 | A | 11/1998 | Boggio, Jr. | |
| 5,846,615 | A | 12/1998 | Sharma et al. | 427/597 |
| 5,853,470 | A | 12/1998 | Martin et al. | 106/31.86 |
| 5,879,715 | A | 3/1999 | Higgins et al. | 424/489 |
| 5,882,722 | A | 3/1999 | Kydd | 427/123 |
| 5,894,038 | A | 4/1999 | Sharma et al. | 427/554 |
| 5,909,083 | A | 6/1999 | Asano et al. | 313/584 |
| 5,930,026 | A | 7/1999 | Jacobson et al. | 359/296 |
| 5,932,280 | A | 8/1999 | Roth | 427/102 |
| 5,953,037 | A | 9/1999 | Hayashi et al. | 347/172 |
| 5,962,085 | A | 10/1999 | Hayashi et al. | 427/585 |
| 5,966,580 | A | 10/1999 | Watanabe et al. | 419/9 |
| 5,992,320 | A | 11/1999 | Kosaka et al. | 101/401.1 |
| 5,997,044 | A | 12/1999 | Behm et al. | 283/83 |
| 5,998,085 | A | 12/1999 | Isberg et al. | 430/200 |
| 6,019,926 | A | 2/2000 | Southward et al. | 264/216 |
| 6,025,026 | A | 2/2000 | Smith et al. | 427/316 |
| 6,027,762 | A | 2/2000 | Tomita et al. | 427/96 |
| 6,036,889 | A | 3/2000 | Kydd | 252/512 |
| 6,042,643 | A | 3/2000 | Belmont et al. | |
| 6,074,725 | A | 6/2000 | Kennedy | 428/188 |
| 6,080,261 | A | 6/2000 | Popat et al. | 156/240 |
| 6,080,928 | A | 6/2000 | Nakagawa | |
| 6,099,897 | A | 8/2000 | Sayo et al. | 427/180 |
| 6,103,393 | A | 8/2000 | Kodas et al. | 428/570 |
| 6,103,868 | A | 8/2000 | Heath et al. | 528/482 |
| 6,108,210 | A * | 8/2000 | Chung | 361/747 |
| 6,109,175 | A | 8/2000 | Kinoshita | 101/170 |
| 6,118,426 | A | 9/2000 | Albert et al. | |
| 6,124,851 | A | 9/2000 | Jacobson | 345/206 |
| 6,133,147 | A | 10/2000 | Rhee et al. | 438/677 |
| 6,143,356 | A | 11/2000 | Jablonski | 427/96 |
| 6,153,348 | A | 11/2000 | Kydd et al. | 430/119 |
| 6,156,837 | A | 12/2000 | Branan, Jr. et al. | |
| 6,159,267 | A | 12/2000 | Hampden-Smith et al. | |
| 6,165,247 | A | 12/2000 | Kodas et al. | |
| 6,169,129 | B1 | 1/2001 | Mahmud et al. | |
| 6,169,837 | B1 | 1/2001 | Kato et al. | |
| 6,177,151 | B1 | 1/2001 | Chrisey et al. | 427/596 |

| Patent | Date | Inventor | Class |
|---|---|---|---|
| 6,184,457 B1 | 2/2001 | Tsuzuki et al. | |
| 6,190,731 B1 | 2/2001 | Tecle | 427/213.3 |
| 6,197,147 B1 | 3/2001 | Bonsel et al. | 156/269 |
| 6,197,366 B1 | 3/2001 | Takamatsu | 427/125 |
| 6,200,405 B1 | 3/2001 | Nakazawa et al. | 156/248 |
| 6,207,268 B1 | 3/2001 | Kosaka et al. | 428/325 |
| 6,214,259 B1 | 4/2001 | Oda et al. | 252/500 |
| 6,214,520 B1 | 4/2001 | Wolk et al. | 430/273.1 |
| 6,238,734 B1 | 5/2001 | Senzaki et al. | 427/226 |
| 6,245,494 B1 | 6/2001 | Andriessen et al. | 430/346 |
| 6,251,471 B1 | 6/2001 | Granoff et al. | 427/97 |
| 6,251,488 B1 | 6/2001 | Miller et al. | 427/596 |
| 6,268,014 B1 | 7/2001 | Eberspacher et al. | |
| 6,270,389 B1 | 8/2001 | Kobayashi et al. | 445/24 |
| 6,274,412 B1 | 8/2001 | Kydd et al. | 438/149 |
| 6,277,169 B1 | 8/2001 | Hampden-Smith et al. | |
| 6,277,740 B1 | 8/2001 | Goldstein | 438/660 |
| 6,294,401 B1 | 9/2001 | Jacobson et al. | 438/99 |
| 6,296,896 B1 | 10/2001 | Takahashi et al. | 427/77 |
| 6,316,100 B1 | 11/2001 | Kodas et al. | |
| 6,317,023 B1 | 11/2001 | Felten | 338/254 |
| 6,323,096 B1 | 11/2001 | Saia et al. | 438/384 |
| 6,328,894 B1 | 12/2001 | Chan et al. | 210/638 |
| 6,329,899 B1 | 12/2001 | Hunt et al. | 338/308 |
| RE37,512 E | 1/2002 | Szlufcik et al. | |
| 6,338,809 B1 | 1/2002 | Hampden-Smith et al. | 264/7 |
| 6,348,295 B1 | 2/2002 | Griffith et al. | 430/198 |
| 6,356,234 B1 | 3/2002 | Harrison et al. | |
| 6,358,567 B2 | 3/2002 | Pham et al. | 427/421 |
| 6,358,611 B1 | 3/2002 | Nagasawa et al. | 428/403 |
| 6,368,378 B2 | 4/2002 | Sasaki | 75/252 |
| 6,372,158 B1 | 4/2002 | Hashimoto et al. | 252/513 |
| 6,379,742 B1 | 4/2002 | Behm et al. | 427/7 |
| 6,379,745 B1 | 4/2002 | Kydd et al. | 427/96 |
| 6,380,778 B2 | 4/2002 | Uehara et al. | 327/175 |
| 6,395,053 B1 | 5/2002 | Fau et al. | 75/362 |
| 6,399,230 B1 | 6/2002 | Tormey et al. | 428/702 |
| 6,413,790 B1 | 7/2002 | Duthaler et al. | |
| 6,416,150 B1 | 7/2002 | Kimura | 347/14 |
| 6,458,327 B1 | 10/2002 | Vossmeyer | 422/68.1 |
| 6,458,431 B2 | 10/2002 | Hill et al. | 427/537 |
| 6,467,897 B1 | 10/2002 | Wu et al. | 347/102 |
| 6,475,840 B1* | 11/2002 | Miyanaga et al. | 438/166 |
| 6,487,774 B1 | 12/2002 | Nakao et al. | 29/890.1 |
| 6,501,663 B1* | 12/2002 | Pan | 361/779 |
| 6,503,831 B2 | 1/2003 | Speakman | 438/674 |
| 6,506,438 B2* | 1/2003 | Duthaler et al. | 427/58 |
| 6,537,359 B1 | 3/2003 | Spa | 106/31.92 |
| 6,541,433 B2 | 4/2003 | Schultz et al. | 510/152 |
| 6,548,036 B2 | 4/2003 | Iida et al. | |
| 6,599,631 B2 | 7/2003 | Kambe et al. | 428/447 |
| 6,645,569 B2 | 11/2003 | Cramer et al. | 427/466 |
| 6,649,138 B2 | 11/2003 | Adams et al. | 423/447 |
| 6,660,680 B1 | 12/2003 | Hampden-Smith et al. | 502/180 |
| 6,667,360 B1 | 12/2003 | Ng et al. | 524/492 |
| 6,697,694 B2 | 2/2004 | Mogensen | |
| 6,713,389 B2 | 3/2004 | Speakman | 438/674 |
| 6,730,400 B1 | 5/2004 | Komatsu et al. | 428/403 |
| 6,743,319 B2 | 6/2004 | Kydd | 156/230 |
| 6,753,108 B1 | 6/2004 | Hampden-Smith et al. | 429/44 |
| 6,773,614 B2 | 8/2004 | Field | 216/5 |
| 6,774,036 B2 | 8/2004 | Goldstein | 438/660 |
| 6,780,765 B2 | 8/2004 | Goldstein | 438/660 |
| 6,811,885 B1 | 11/2004 | Andriessen et al. | 428/464 |
| 6,814,795 B2 | 11/2004 | McVicker et al. | |
| 6,827,772 B2 | 12/2004 | Foster | |
| 6,830,778 B1 | 12/2004 | Schulz et al. | 427/123 |
| 6,855,196 B2 | 2/2005 | Kawamura et al. | 106/31.6 |
| 6,855,378 B1* | 2/2005 | Narang | 427/553 |
| 6,880,909 B2 | 4/2005 | King et al. | 347/19 |
| 6,881,239 B2 | 4/2005 | Uchida | 75/252 |
| 6,939,576 B2 | 9/2005 | Deshpande et al. | 427/223 |
| 6,951,666 B2 | 10/2005 | Kodas et al. | 427/376.6 |
| 6,958,095 B2 | 10/2005 | Kakimoto et al. | |
| 7,067,867 B2* | 6/2006 | Duan et al. | 257/296 |
| 7,084,016 B1* | 8/2006 | Yamazaki et al. | 438/149 |
| 7,115,218 B2 | 10/2006 | Kydd et al. | |
| 7,121,642 B2* | 10/2006 | Stoessel et al. | 347/19 |
| 7,190,008 B2* | 3/2007 | Amundson et al. | 257/226 |
| 7,524,528 B2 | 4/2009 | Kodas et al. | |
| 7,533,361 B2 | 5/2009 | Edwards | |
| 7,553,512 B2 | 6/2009 | Kodas et al. | |
| 7,585,349 B2 | 9/2009 | Xia et al. | |
| 7,597,769 B2 | 10/2009 | Hampden-Smith et al. | |
| 7,625,420 B1 | 12/2009 | Kodas et al. | |
| 7,629,017 B2 | 12/2009 | Kodas et al. | |
| 2001/0004477 A1 | 6/2001 | Fukunaga et al. | 427/475 |
| 2001/0009429 A1* | 7/2001 | Soto et al. | 347/19 |
| 2001/0017085 A1 | 8/2001 | Kubo et al. | |
| 2002/0006723 A1 | 1/2002 | Goldstein | 438/660 |
| 2002/0018861 A1 | 2/2002 | Hill et al. | 427/532 |
| 2002/0020491 A1 | 2/2002 | Price et al. | 156/307.1 |
| 2002/0058143 A1 | 5/2002 | Hunt et al. | 428/412 |
| 2002/0079832 A1* | 6/2002 | Van Tongeren et al. | 313/504 |
| 2002/0131254 A1 | 9/2002 | Schaper | 361/760 |
| 2002/0146564 A1 | 10/2002 | Takai et al. | |
| 2002/0148640 A1 | 10/2002 | Holl et al. | 174/256 |
| 2002/0150678 A1 | 10/2002 | Cramer et al. | 427/212 |
| 2002/0151161 A1 | 10/2002 | Furusawa | 438/597 |
| 2002/0176987 A1 | 11/2002 | Yadav et al. | 428/402 |
| 2003/0003231 A1 | 1/2003 | Kiguchi et al. | |
| 2003/0009726 A1 | 1/2003 | Chang et al. | |
| 2003/0020768 A1 | 1/2003 | Renn | 347/2 |
| 2003/0060038 A1 | 3/2003 | Sirringhaus et al. | |
| 2003/0063155 A1 | 4/2003 | Nakao et al. | 347/44 |
| 2003/0070569 A1 | 4/2003 | Bulthaup et al. | 101/127 |
| 2003/0070747 A1 | 4/2003 | Kydd | 156/233 |
| 2003/0073042 A1 | 4/2003 | Cernigliaro et al. | 430/321 |
| 2003/0082485 A1 | 5/2003 | Bulthaup et al. | 430/312 |
| 2003/0083203 A1 | 5/2003 | Hashimoto et al. | |
| 2003/0085057 A1 | 5/2003 | Hashimoto | |
| 2003/0096056 A1 | 5/2003 | Kawamura et al. | 427/66 |
| 2003/0102099 A1 | 6/2003 | Yadav et al. | 162/208 |
| 2003/0108664 A1 | 6/2003 | Kodas et al. | 427/125 |
| 2003/0110978 A1 | 6/2003 | Abe et al. | 106/31.13 |
| 2003/0116057 A1 | 6/2003 | Suzuki et al. | 106/31.33 |
| 2003/0123259 A1 | 7/2003 | Furuya et al. | 362/489 |
| 2003/0124259 A1 | 7/2003 | Kodas et al. | 427/376.6 |
| 2003/0145680 A1 | 8/2003 | Uchida | 75/252 |
| 2003/0146019 A1 | 8/2003 | Hirai | |
| 2003/0148024 A1 | 8/2003 | Kodas et al. | 427/125 |
| 2003/0151030 A1 | 8/2003 | Gurin | 252/502 |
| 2003/0161959 A1 | 8/2003 | Kodas et al. | 427/376.2 |
| 2003/0168639 A1 | 9/2003 | Cheon et al. | 252/500 |
| 2003/0175411 A1 | 9/2003 | Kodas et al. | 427/58 |
| 2003/0180451 A1 | 9/2003 | Kodas et al. | 427/123 |
| 2003/0183165 A1 | 10/2003 | Kakimoto et al. | 118/35 |
| 2003/0185889 A1 | 10/2003 | Yan et al. | 424/484 |
| 2003/0201244 A1 | 10/2003 | Ogawa et al. | |
| 2003/0995718 | 10/2003 | Mangold et al. | |
| 2003/0207949 A1 | 11/2003 | Klabunde et al. | 516/9 |
| 2003/0211246 A1 | 11/2003 | Kydd et al. | 427/282 |
| 2003/0213614 A1 | 11/2003 | Furusawa et al. | |
| 2003/0215565 A1 | 11/2003 | Chang et al. | |
| 2003/0224104 A1 | 12/2003 | Fukunaga et al. | |
| 2003/0228748 A1 | 12/2003 | Nelson et al. | |
| 2004/0004209 A1 | 1/2004 | Matsuba et al. | 252/518.1 |
| 2004/0030019 A1 | 2/2004 | Kim et al. | 524/431 |
| 2004/0038808 A1 | 2/2004 | Hampden-Smith et al. | |
| 2004/0043691 A1 | 3/2004 | Abe et al. | 445/24 |
| 2004/0058457 A1 | 3/2004 | Huang et al. | 436/524 |
| 2004/0074336 A1 | 4/2004 | Daimon et al. | |
| 2004/0126708 A1 | 7/2004 | Jing et al. | |
| 2004/0140549 A1 | 7/2004 | Miyagawa | |
| 2004/0142165 A1 | 7/2004 | Fujii et al. | |
| 2004/0144202 A1 | 7/2004 | Conaghan et al. | 252/500 |
| 2004/0144959 A1 | 7/2004 | Conaghan et al. | 252/500 |
| 2004/0145858 A1 | 7/2004 | Sakurada | |
| 2004/0151893 A1 | 8/2004 | Kydd et al. | 428/323 |
| 2004/0160465 A1 | 8/2004 | Baker-Smith et al. | |
| 2004/0173144 A1 | 9/2004 | Edwards et al. | 118/300 |
| 2004/0182533 A1 | 9/2004 | Blum et al. | 162/135 |
| 2004/0191695 A1 | 9/2004 | Ray et al. | |
| 2004/0196329 A1 | 10/2004 | Ready et al. | |
| 2004/0201648 A1 | 10/2004 | Sekiya | |
| 2004/0206941 A1 | 10/2004 | Gurin | 252/500 |
| 2004/0223926 A1 | 11/2004 | Kobayashi | |
| 2004/0231594 A1 | 11/2004 | Edwards et al. | 118/719 |

| | | | |
|---|---|---|---|
| 2004/0239730 A1 | 12/2004 | Kurosawa | |
| 2004/0247842 A1 | 12/2004 | Koyama et al. | 428/195.1 |
| 2004/0250750 A1 | 12/2004 | Reda et al. | 117/84 |
| 2004/0261700 A1 | 12/2004 | Edwards et al. | |
| 2004/0263564 A1 | 12/2004 | Maekawa et al. | |
| 2004/0265549 A1 | 12/2004 | Kydd | 428/201 |
| 2005/0009230 A1 | 1/2005 | Hasei | |
| 2005/0037614 A1 | 2/2005 | Fukuchi | |
| 2005/0056118 A1 | 3/2005 | Xia et al. | |
| 2005/0078158 A1 | 4/2005 | Magdassi et al. | 347/100 |
| 2005/0116203 A1 | 6/2005 | Takahashi et al. | 252/500 |
| 2005/0207930 A1 | 9/2005 | Yamaguchi | |
| 2005/0238804 A1 | 10/2005 | Garbar et al. | |
| 2006/0001726 A1 | 1/2006 | Kodas et al. | |
| 2006/0047014 A1 | 3/2006 | Hopper et al. | |
| 2006/0065946 A1* | 3/2006 | Mehrad et al. | 257/530 |
| 2006/0083694 A1 | 4/2006 | Kodas et al. | |
| 2006/0158497 A1 | 7/2006 | Vanheusden et al. | |
| 2006/0159603 A1 | 7/2006 | Vanheusden et al. | |
| 2006/0162497 A1 | 7/2006 | Kodas et al. | |
| 2006/0163744 A1 | 7/2006 | Vanheusden et al. | |
| 2006/0165898 A1 | 7/2006 | Kodas et al. | |
| 2006/0165910 A1 | 7/2006 | Kodas et al. | |
| 2006/0166057 A1 | 7/2006 | Kodas et al. | |
| 2006/0176350 A1 | 8/2006 | Howarth et al. | |
| 2006/0189113 A1 | 8/2006 | Vanheusden et al. | |
| 2008/0035371 A1* | 2/2008 | Jow et al. | 174/260 |
| 2009/0053400 A1 | 2/2009 | la Vega et al. | |

FOREIGN PATENT DOCUMENTS

| | | |
|---|---|---|
| EP | 0 449 309 B9 | 3/1991 |
| EP | 0 537 502 B1 | 9/1992 |
| EP | 0 641 670 B1 | 8/1994 |
| EP | 0 696 515 B1 | 5/1995 |
| EP | 0 930 641 A3 | 1/1999 |
| EP | 0 995 718 B1 | 9/1999 |
| EP | 0 977 212 A2 | 2/2000 |
| EP | 0 982 090 A1 | 3/2000 |
| EP | 1 083 578 A1 | 3/2001 |
| EP | 2270872 | 5/2001 |
| EP | 1 107 298 A2 | 6/2001 |
| EP | 1 302 895 A3 | 4/2002 |
| EP | 1 335 393 A1 | 4/2002 |
| EP | 0 995 718 B1 | 11/2002 |
| EP | 1 493 780 A1 | 4/2003 |
| EP | 1 323 793 A1 | 7/2003 |
| EP | 1 340 568 A1 | 9/2003 |
| EP | 1 342 760 A1 | 9/2003 |
| EP | 1 544 905 A1 | 9/2003 |
| EP | 1 515 348 A2 | 3/2005 |
| EP | 1801890 | 3/2010 |
| JP | 62-113164 | 5/1987 |
| JP | 01-303787 | 7/1989 |
| JP | 2002-124016 | 5/1990 |
| JP | 2000-011875 | 1/2000 |
| JP | 2000-182889 | 6/2000 |
| JP | 2004-311725 | 4/2004 |
| JP | 2004235272 | 8/2004 |
| JP | 2005-191059 | 7/2005 |
| JP | 2005-219873 | 8/2005 |
| WO | WO 89/05567 | 6/1989 |
| WO | WO 97/48257 | 12/1997 |
| WO | WO 98/37133 A1 | 8/1998 |
| WO | 9919900 | 4/1999 |
| WO | WO 99/16556 A1 | 4/1999 |
| WO | WO 99/16601 A1 | 4/1999 |
| WO | WO 99/17351 A1 | 4/1999 |
| WO | WO 99/061911 | 12/1999 |
| WO | WO 00/10197 A | 2/2000 |
| WO | WO 00/10736 | 3/2000 |
| WO | WO 00/29208 A1 | 5/2000 |
| WO | WO 00/69235 A1 | 11/2000 |
| WO | WO 00/72224 A1 | 11/2000 |
| WO | WO 01/54203 A2 | 7/2001 |
| WO | WO/01/56736 A2 | 8/2001 |
| WO | WO 01/82315 A1 | 11/2001 |
| WO | WO 01/87503 A1 | 11/2001 |
| WO | WO 02/04698 A2 | 1/2002 |
| WO | WO 02/05294 A1 | 1/2002 |
| WO | 02087749 | 11/2002 |
| WO | WO 02/098576 A1 | 12/2002 |
| WO | 03016961 | 2/2003 |
| WO | WO 03/018645 A1 | 3/2003 |
| WO | WO 03/032084 A2 | 4/2003 |
| WO | WO 03/035279 A1 | 5/2003 |
| WO | WO 03/038002 A1 | 5/2003 |
| WO | WO 03/51562 A1 | 6/2003 |
| WO | WO 03/106573 A1 | 12/2003 |
| WO | WO 2004/027787 A1 | 4/2004 |
| WO | WO 2004/030072 A1 | 4/2004 |
| WO | WO 2004/050260 A3 | 6/2004 |
| WO | WO 2004/050350 A1 | 6/2004 |
| WO | WO 2004/062890 A2 | 7/2004 |
| WO | WO 2004/063295 A1 | 7/2004 |
| WO | WO 2004/068918 A3 | 8/2004 |
| WO | WO 2004/078641 A1 | 9/2004 |
| WO | WO 2004/104153 A1 | 12/2004 |
| WO | WO 2004/105985 A1 | 12/2004 |
| WO | WO 2005/044451 A1 | 5/2005 |
| WO | 2006078825 | 7/2006 |
| WO | 2007053408 | 5/2007 |
| WO | 2007149883 | 12/2007 |

OTHER PUBLICATIONS

Dispersion and Stability of Silver Inks, Tay, et al., "Journal of Materials Science" vol. 37, pp. 4653-4661 (2002).

Ethylene Glycol-Mediated Synthesis of Metal Oxide Nanowires, X. Jiang, Y. Wang, T. Herricks, Y. Xia, "Journal of Materials Chemistry" 14, 695-703 (2004).

Fine Line Conductor Manufacturing Using Drop-On-Demand PZT Printing Technology, Szczech, et al. "IEEE Transactions on Electronics Packaging Manufacturing" vol. 25, No. 1 (2002).

Gold and Silve Nanoparticles: A Class of Chromophores with Colors Tunable in the Range from 400 to 750 nm, Y. Sun, Y. Xia, "The Analyst, The Royal Scoiety of Chemistry" 128, 686-691 (2003).

Ink Jet Printing of Hybrid Circuits, R.W. Vest, Tweedell and B.C. Buchanan, "Hybrid Microelectronics" 6, 261, 267 (1983).

Ink-Jet Printed Nanoparticle Microelectromechanical Systems, Fuller, et al., "Journal of Microelectromechanical Systems" vol. 11, No. 1 (2002).

Ink-Jet Printing of Catalyst Patterns for Electroless Metal Deposition, Shah, et al., "American Chemical Society" 15, 1584-1587 (1999).

Large-Scale Synthesis of Monodisperse Nanorods of Se/Te Alloys Through a Homogeneous Nucleation and Solution Growth Process, B. Mayers, B. Gates, Y. Yin, Y. Xia, "Advanced Materials" 13, No. 18 (2001).

Large-Scale Synthesis of Silver Nanocubes: The Role of HICl in Promoting Cube Perfection and Monodispersity, S.H. Im, Y.T. Lee, B. Wiley, V. Xia "Angewandte Chemical International Edition" 44, 2154-2157 (2005).

Large-Scale Synthesis of Uniform Silver Nanowires through a Soft, Self-Seeding, Polyol Process "Advanced Materials" 14, No. 11 (2002).

Late-News Paper: Inkjet-Printed Bus and Address Electrodes for Plasma Display, Furusawa, et al., "SID 02 Digest" pp. 753-755.

Liquid Ink Jet Printing With MOD Inks for Hybrid Microcircuits, K.F. Tens, R.W. Vest "IEEE Transaction on Components, Hybrids and Manufacturing Technology" vol. CHMT-12, No. 4, 545-549 (1987).

Materials, Silver Ink for Jet Printing "NASA Tech Briefs" Aug. 1989.

Microwave-polyol Process for Metal Nanophases, S. Komarneni, H. Katsuki, D. Li, A.S. Bhalla "Journal of Physics, Condensed Matter" 16, S1305-S1312 (2004).

New Development of Nonlinear Optical Crystals for the Ultraviolet Region with Molecular Engineering Approach, C. Chen, Y. Wang, Y. Xia, B. Wu, D. Tang, K. Wu, Z. Wenrong, L. Yu, L. Mei "Journal of Applied Physics" 77, (6) 1995).

New Nonlinear Optical Crystals for UV and VUV Harmonic Generation, Y. Xia, C. Chen, D. Tang, B Wu Advanced Materials: 7, No. 1 (1995).

Physical Mechanisms Governing Pattern Fidelity in Microscale Offset Printing, Darhuber, et al. "Journal of Applied Physics", vol. 90, No. 7, pp. 3602-3609 (2001).
Polyol Synthesis of Uniform Silver Nanowires: A Plausible Growth Mechanism and the Supporting Evidence, Y. Sun, B Mayers, T. Herricks, Y. Xia "Nano Letters" vol. 3, No. 7, 955-960 (2003).
Polyol Synthesis of Silver Nanoparticles: Use of Choloride and Oxygen to Promote the Formation of Single-Crystal, Truncated Cubes and Tetrahedrons, B. Wiley, T. Herricks, Y. Sun, Y. Xia "Nano Letters" vol. 4, No. 9, 1733-1739 (2004).
Polyol Synthesis of Platinum Nanoparticles: Control of Morphology with Sodium Nitrate, T. Herricks, J. Chen, Y. Xia "Nano Letters" vol. 4, No. 12, 2367-2371 (2004).
Polyol Synthesis of Platinum Nanostructures: Control of Morphology Through the Manipulation of Reduction Kinetics, J. Chen, T. Herricks, Y. Xia "Angewandte Chemical International Edition" 44, 2589-2592 (2005).
Polyol Synthesis of Silver Nanostructures: Control of Product Morphology with Fe(II) or Fe(III) Species, B. Wiley, Y. Sun, Y. Xia "Langmuir The ACS Journal of Surfaces and Colloids" Vo 21, No. 18 (2005).
Preparation and Characterization of Nano-Sized Ag/PVP Composites for Optical Applications, G Carotenuto, G.P. Pepe, L. Nicolais "The European Physical Journal B" 16, 11-17 (2000).
Preparation of Colloidal Silver Dispersions by the Polyol Process Part 1—Synthesis and Characterization, P.Y. Silvert, R. Herrera-Urbina, N. Duvauchelle, V. Vijayakrishan, K. Tekaia-Elhsissen "Journal of Materials Chemistry" 6(4), 573-577 (1996).
Preparation of Colloidal Silver Dispersions by The Polyol Process Part 2—Mechanism of Particle Formation, P.-Y. Silvert, R. Herrera-Urbina, K. Tekaia-Elhsissen "Journal of Materials Chemistry"7(2), 293-299 (1997).
Preparation of Gold, Platinum, Palladium and Silver Nanoparticles by the Reduction of their Salts with a Weak Reductant-Potassium Bitartrate, Y. Tan, X. Dai, Y. Li, D. Zhu "Journal of Materials Chemistry" 13, 1069-1075 (2003).
Preparation of Polychrome Silver Nanoparticles in Different Solvents, R. He, X. Qian, J. Yin, Z. Zhu "Journal of Materials Chemistry" 12, 3783-3786 (2002).
PVP Protective Mechanism of Ultrafine Silve Powder Synthesized by Chemical Reductioh Processes, Z. Zhang, B. Zhao, L. Hu "Journal of Solid State Chemistry" 121, 105-110, Article No. 0015 (1996).
Shape-Controlled Synthesis of Gold and Silver Nanoparticles, Y. Sun, Y. Xia "Science Magazine" vol. 298, pp. 2176-2179 (2002).
Shape-Controlled Synthesis of Silver and Gold Nanostructures, B. Wiley, Y. Sun, J. Chen, H. Cang, Z.Y. Li, X. Li, Y. Xia "MRS Bulletin" vol. 30 (2005).
Silver Nanowires Can Be Directly Coated with Amorphous Silica to Generate Well-Controlled Coaxial Nanocables of Silver/Silica, Y. Yin, Y. Lu, Y. Sun, Y. Xia "Nano Letters" vol. 2, No. 4, 427-430 (2002).
Site Selective Copper and Silver Electroless Metallization Facilitated by a Photolithographically Patterned Hydrogen Silsesquioxane Mediated Seed Layer, Harness, et al. "American Chemical Society".
Snythesis of Monodisperse Au, Pt, Pd, Ru and Ir Nanoparticles in Ethylene Glycol, F.Bonet, V. Delmas, S. Grugeon, R. Herrera Urbina, P-Y. Silvert, K. Tekaia-Elhsissen "NanoStructured Materials" vol. 11, No. 8, pp. 1277-1284 (1999).
Synthesis of Monodisperse Submicronic Gold Particles by the Polyol Process, P-Y. Silvert, K. Tekaia-Elhsissen "Solid State Ionics" 82, 53-60 (1995).
Tape Compositions for The Deposition of Electronic Features, T. Kodas, U.S. Appl. No. 10/274,495 (Oct. 18, 2002).
Transformation of Silver Nanospheres into Nanobelts and Triangular Nanoplates Through a Thermal Process, Y. Sun, B. Mayers, Y. Xia "Nano Letters" vol. 3, No. 5, 675-679 (2003).
Triangular Nanoplates of Silver: Synthesis, Characterization, and Use as Sacrificial Templates for Generating Triangular Nanorings of Gold, Y. Sun, Y. Xia "Advanced Materials" 15, No. 9 (2003).
Uniform Silver Nanowires Synthesis by Reducing AgNO3 with Ethylene Glycol in the Presence of Seeds and Poly(Vinyl Pyrrolidone), Y. Sun, Y. Yin, B.T. Mayers, T. Herricks, Y. Xia "Chemical Materials" 14, 4736-4745 (2002).

ITT Cuts Costs of PC Board Manufacturing, K. Dreyfack, "Electronics" vol. 52, No. 17 (1979).
(2005) "How Printable Computers Will Work", Worldwide Web Reference Source, http://computer.howstuffworks.com/printable-computer.htm/printable Date Retrieved: May 23, 2005.
(2005) "Definitions of inkjet printer on the Web:", Worldwide Web Reference Source, hftp://www.google.com/search?hI=en&Ir=&oi+defmore&q=define:inkjet+printer Date Retrieved: May 23, 2005.
(2005) "Screen Printing Technology, Principles of Screen-printing", Worldwide Web Reference Source, http://www.spauk.co.uk/TechnicalPages/Screen%20TP.polf Date Retrieved: May 3, 2006.
(Unknown) "Lithography—definition of Lithography in Encyclopedia", Worldwide Web Reference Source, http://encyclopedia.laborlawtalk.com/Lithography Date Retrieved: May 25, 2005.
(2006) "Photolithography: Definition and Much More From Answers.com", Worldwide Web Reference Source, http://www.answers.com/topic/photolithography Date Retrieved: May 25, 2005.
(Dec. 3, 2002) "Printing Drawings and Photographic Images", Worldwide Web Reference Source, http://histclo.hispeed.com/photo/photo-print.html Date Retrieved: May 25, 2005.
(Apr. 5, 2006) "Photolithography", Worldwide Web Reference Source, http://www.ece.gatech.edu/research/labs/vc/theory/photolith.html Date Retrieved: May 25, 2005.
Measurement of Clay Surface Areas by Polyvinylpyrrolidone (PVP) Sorption and Its Use for Quantifying Illite and Smectite Abundance, A.E. Blum, D.D. Eberl, "Clays and Clay Mineals", vol. 52, No. 5, 589-602 (2004).
Metal Nanoparticle Compositions, Vanheusden, et al. U.S. Appl. No. 11/331,211 (Jan. 13, 2006).
Separation of Metal Nanoparticles, Vanheusden, et al. U.S. Appl. No. 11/331,238 (Jan. 13, 2006).
Production of Metal Nanoparticles, Vanheusden, et al. U.S. Appl. No. 11/331,230 (Jan. 13, 2006).
Printable Electronic Conductors, Vanheusden, et al. U.S. Appl. No. 11/231,231 (Jan. 13, 2006).
Replacement of Passive Electrical Components, Howarth, et al. U.S. Appl. No. 11/331,186 (Jan. 13, 2006).
Circuit Modeling and Selective Deposition, Howarth, et al. U.S. Appl. No. 11/331,188 (Jan. 13, 2006).
Ink-Jet Printing of Compositionally Non-Uniform Features, Vanheusden, et al. U.S. Appl. No. 11/331,237 (Jan. 13, 2006).
Printable Electronic Features on Non-Uniform Substrate and Processes for Making Same, Vanheusden, et al., U.S. Appl. No. 11/331,190 (Jan. 13, 2006).
Controlling Ink Migration During the Formation of Printable Electronic Features, Kowalski, et al., U.S. Appl. No. 11/331,185 (Jan. 13, 2006).
Processes for Planarizing Substrates and Enapsulating Printable Electronic Features, Mark Kowalski, U.S. Appl. No. 11/331,239 (Jan. 13, 2006).
Optimized Multi-Layer Printing of Electroics and Displays, Edwards, et al. U.S. Appl. No. 11/331,187 (Jan. 13, 2006).
A System and Process for Manufacturing Application Specific Printable Circuits (ASPC's) and Other Custom Electronic Devices, Chuck Edwards, U.S. Appl. No. 11/331,189 (Jan. 13, 2006).
All-Polymer Thin Film Transistors Fabricated by High-Resolution Ink-jet Printing, Kawase, T., et al., "IEEE International Electron Devices Meeting", pp. 25.5.1-25.5.4 (2000).
All-Polymer Thin Film Transistor Fabricated by High-Resolution Ink-Jet Printing, Shimoda, T., et al., "IEEE International Solid-State Circuits Conference" Session. 16 (2004).
Custom Color Liquid Ink Development (LID) Process, Goodman, N.B., "Xerox Disclosure Journal" vol. 21, No. 2, p. 157 (1996).
Ink Jet color Copier and Universal Printer, Pearson, R.C., et al., "IBM Technical Disclosure Bulletin" vol. 16, No. 1, pp. 144-145 (1973).
Pending U.S. Appl. No. 11/331,237, entitled "Ink-Jet Printing of Compositionally Non-Uniform Features", filed Jan. 13, 2006.
Pending U.S. Appl. No. 11/331,185, entitled "Controlling Ink Migration During the Formation of Printable Electronic Features", filed Jan. 13, 2006.
Pending U.S. Appl. No. 11/331,186, entitled "Replacement of Passive Electrical Components", filed Jan. 13, 2006.

Pending U.S. Appl. No. 11/331,239, entitled "Processes for Planarizing Substrates and Encapsulating Printable Electronic Features", filed Jan. 13, 2006.

Pending U.S. Appl. No. 11/331,189, entitled "A System and Process for Manufacturing Application Specific Printable Circuits (ASPC's) and Other Custom Electronic Devices", filed Jan. 13, 2006.

Pending U.S. Appl. No. 11/331,191, entitled "A System and Process for Manufacturing Custom Electronics by Combining Traditional Electronics With Printable Electronics", filed Jan. 13, 2006.

Inkjet Printing of Nanosized Silver Colloids, Lee, H-H. et al., "Nanotechnology" 16, pp. 2436-2441 (2005).

Monolayer-Protected Clusters: Molecular Precursors to Metal Films, Wuelfing, P.W. et al., "American Chemical Society" vol. 13, No. 1, pp. 87-95 (2001).

Oligomeric Ketoester Precursors for Improved Polyimide Planarization and Gapfilling; "IBM Technical Disclosure Bulletin", vol. 30, No. 1, pp. 343-346 (1987).

Porosity-Grain Growth Relationships in the Sintering of Nanocrystalline Ceramics, Mayo, M.J. et al., "Nanostructured Materials" vol. 3, pp. 43-52 (1993).

Smoothing of Irregular SiO2 Surfaces, Spencer, O.S., "IBM Technical Disclosure Bulletin" vol. 20, No. 11B, pp. 4842-4843 (1978).

Blum, A.E., et al., "Measurement of Clay Surface Areas by Polyvinylpyrrolidone (PVP) Sorption and Its Use for Quantifying Illite and Smectite Abundance", *Clays and Clay Minerals*, vol. 52, No. 5, pp. 589-602 (2004).

Carotenuto, G., et al., "A Qualitative Model for the Growth Mechanism of Silver Clusters in Polymer Solution", *The European Physical Journal B*, 24, pp. 437-441 (2001).

Fievet, F., et al., "Preparing Monodisperse Metal Powders I Micrometer and Submicrometer Sizes by the Polyol Process", *MRS Bulletin*, Dec. 1989.

Lee, H.K., et al., "One-step preparation of ultrafine poly(acrylonitrile) fibers containing silver nanoparticles", *Materials Letters*, 59, pp. 2977-2980 (2005).

Xia, Y., et al., "Shape-Controlled Synthesis of Metal Nanostructures: The Case of Silver", *Chemistry, A European Journal*, 11, pp. 454-463 (2005).

Kwon, Viscosity of magnetic particle suspension, Journal of Molecular Liquids 75 (1998) 115-126.

Palchik et al., Preparation and Characterization of Ni/NiO Composite using Microwave Irradiation and Sonication, NanoStructured Materials, vol. 11. No. 3, pp. 415-420, 1999.

A System and Process for Manufacturing Custom Electronics by Combining Traditional Electronics With Printable Electronics, Chuck Edwards, U.S. Appl. No. 11/331,191 (Jan. 13, 2006).

Security Features, Their Use, and Processes for Making Them, Hampden-Smith, et al. U.S. Appl. No. 11/331,233 (Jan. 13, 2006).

\* cited by examiner

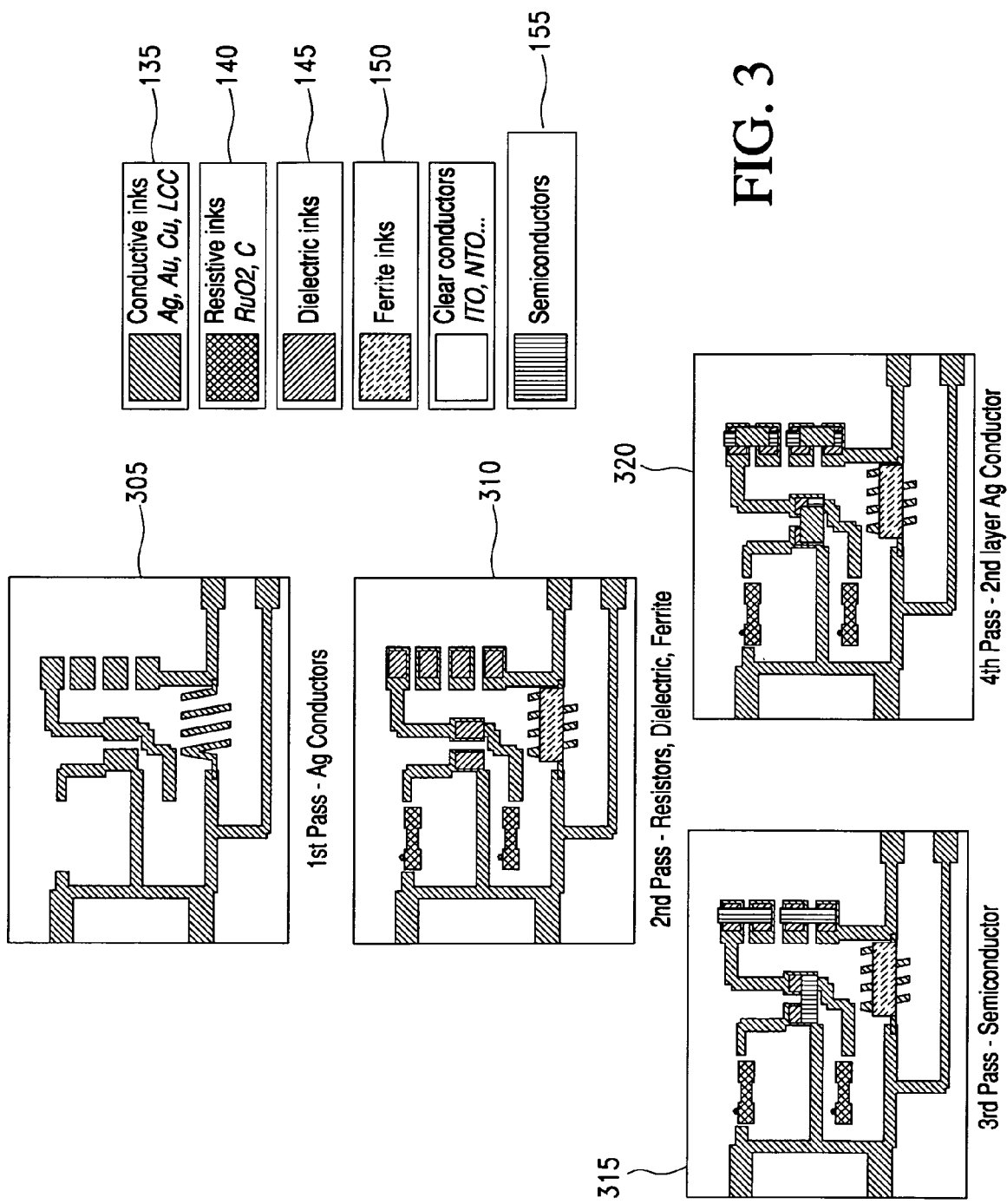

OPTIMIZED MULTI-LAYER PRINTING OF ELECTRONICS AND DISPLAYS

CROSS-REFERENCE TO RELATED APPLICATIONS

This application claims priority to U.S. Provisional Patent Application Ser. Nos. 60/643,577; 60/643,378; and 60/643,629, all filed on Jan. 14, 2005, the entireties of which are incorporated herein by reference. This application also claims priority to U.S. Provisional Patent Application Ser. No. 60/695,415, filed on Jul. 1, 2005, the entirety of which is incorporated herein by reference.

STATEMENT REGARDING FEDERALLY-SPONSORED RESEARCH/DEVELOPMENT

This invention was made with Government support under Agreement No. MDS972-93-2-0014 or DAAD19-02-3-0001 awarded by the Army Research Laboratory ("ARL"). The Government has certain rights in the invention.

BACKGROUND OF THE INVENTION

1. Field of the Invention

The present invention relates to electrical circuits. More particularly, the invention relates to a method and apparatus for printing an electrical circuit onto a substrate using electronic inks that, when cured, have electrical functionalities.

2. Related Art

The electronics, display and energy industries rely on the formation of coatings and patterns of conductive materials to form circuits on organic and inorganic substrates. The primary methods for generating these patterns are screen printing for features larger than about 100 µm and thin film and etching methods for features smaller than about 100 µm. Other subtractive methods to attain fine feature sizes include the use of photo-patternable pastes and laser trimming.

One consideration with respect to patterning of conductors is cost. Non-vacuum, additive methods generally entail lower costs than vacuum and subtractive approaches. Some of these printing approaches utilize high viscosity flowable liquids. Screen-printing, for example, uses flowable mediums with viscosities of thousands of centipoise. At the other extreme, low viscosity compositions can be deposited by methods such as ink-jet printing. However, low viscosity compositions are not as well developed as the high viscosity compositions.

Ink-jet printing of conductors has been explored, but the approaches to date have been inadequate for producing well-defined features with good electrical properties, particularly at relatively low temperatures.

There exists a need for compositions for the fabrication of electrical conductors for use in electronics, displays, and other applications. Further, there is a need for compositions that have low processing temperatures to allow deposition onto organic substrates and subsequent thermal treatment. It would also be advantageous if the compositions could be deposited with a fine feature size, such as not greater than about 100 µm, while still providing electronic features with adequate electrical and mechanical properties.

An advantageous metallic ink and its associated deposition technique for the fabrication of electrically electrical conductors would combine a number of attributes. The electrical conductor would have high conductivity, preferably close to that of the pure bulk metal. The processing temperature would be low enough to allow formation of conductors on a variety of organic substrates (polymers). The deposition technique would allow deposition onto surfaces that are non-planar (e.g., not flat). The conductor would also have good adhesion to the substrate. The composition would desirably be inkjet printable, allowing the introduction of cost-effective material deposition for production of devices such as flat panel displays (PDP, AMLCD, OLED). The composition would desirably also be flexo, gravure, or offset printable, again enabling lower cost and higher yield production processes as compared to screen printing.

Further, there is a need for electronic circuit elements, particularly electrical conductors, and complete electronic circuits fabricated on inexpensive, thin and/or flexible substrates, such as paper, using high volume printing techniques such as reel-to-reel printing. Recent developments in organic thin film transistor (TFT) technology and organic light emitting device (OLED) technology have accelerated the need for complimentary circuit elements that can be written directly onto low cost substrates. Such elements include conductive interconnects, electrodes, conductive contacts and via fills.

Existing printed circuit board technologies use process steps and rigidly define the printed circuit board in the context of layers. Only one layer of conductive material is permitted per layer due to the copper etch process used. In general, devices cannot be mounted on internal layers.

SUMMARY OF INVENTION

In one aspect, the invention provides a printed circuit board comprising a substrate and an electrical circuit. The circuit is formed by deposition of a plurality of electronic inks onto the substrate and curing of each of the electronic inks. The deposition may be performed using an ink-jet printing process. The ink-jet printing process may include the step of printing a plurality of layers, wherein a first layer includes at least one electronic ink deposited directly onto the substrate, and wherein each subsequent layer includes at least one electronic ink deposited on top of at least a portion of a previous layer when the previous layer has been cured. One or more of the layers may include at least two of the electronic inks. The electrical circuit may include a plurality of components and a plurality of interconnections between components. Each of the electronic inks may have at least one electrical characteristic when cured. Each component and each interconnection may be formed by using the electrical characteristic(s) of each cured electronic ink to determine a positional layout of droplets for deposition of at least one electronic ink. Each of the components and each of the interconnections may be selected from the group consisting of a conductor; a resistor; a capacitor; an inductor; a transistor; a dielectric insulator; a sensor; a diode; a keyboard; an input device; a switch; a relay; and a pixel.

Alternatively, the deposition may be performed using a process selected from the group consisting of photolithography, flexography, gravure, and screen printing. A first portion of the deposition may be performed using an ink-jet printing process and a second portion of the deposition may be performed using a process selected from the group consisting of photolithography, flexography, gravure, and screen printing. Each of the electronic inks may be selected from the group consisting of a conductive ink; a resistive ink having a resistivity greater than 10,000 ohms per square of printed ink when cured; a resistive ink having a resistivity less than 10,000 ohms per square and greater than 500 ohms per square when cured; a resistive ink having a resistivity less than 500 ohms per square when cured; a high-K dielectric ink having a dielectric constant greater than 50.0 when cured; a low-k dielectric ink having a dielectric constant less than 50.0 when cured; an insulative ink; a ferrite ink; a clear conductive ink; and a semiconductive ink.

In another aspect, the invention provides a process for designing a printable electrical circuit. The process includes the steps of: a) selecting a plurality of electronic inks to be used to form the circuit; and b) determining a print layout. The print layout includes at least one layer of at least one of the plurality of electronic inks printed onto a substrate. The step of determining a print layout includes determining a position for each droplet of electronic ink within each layer such that, when cured, the electronic inks are positioned to form the circuit.

In yet another aspect, a process for designing a printable electrical circuit is provided. The circuit includes a plurality of components and interconnections between components. The process includes the steps of: a) selecting a plurality of electronic inks to be used to form the components and interconnections; and b) determining a print layout for the circuit. The print layout includes at least one layer of at least one of the plurality of electronic inks printed onto a substrate. The step of determining a print layout includes determining a position for each droplet of electronic ink within each layer such that, when cured, the electronic inks are positioned to form the circuit. The print layout may include at least one layer of at least two of the electronic inks printed onto the substrate. The step of determining a print layout may further include the step of determining a deposition method to be used for each layer. The deposition method may be selected from the group consisting of ink-jet printing, photolithography, flexography, gravure, and screen printing. The step of determining a deposition method to be used for each layer may further include determining a first deposition method to be used for at least one layer and a second deposition method to be used for another layer, wherein each of the first and second deposition methods is selected from the group consisting of ink-jet printing, photolithography, flexography, gravure, and screen printing.

Each of the electronic inks may be selected from the group consisting of a conductive ink; a resistive ink having a resistivity greater than 10,000 ohms per square of printed ink when cured; a resistive ink having a resistivity less than 10,000 ohms per square and greater than 500 ohms per square when cured; a resistive ink having a resistivity less than 500 ohms per square when cured; a high-K dielectric ink having a dielectric constant greater than 50.0 when cured; a low-k dielectric ink having a dielectric constant less than 50.0 when cured; an insulative ink; a ferrite ink; a clear conductive ink; and a semiconductive ink. Each of the components may be selected from the group consisting of a conductor; a resistor; a capacitor; an inductor; a transistor; a dielectric insulator; a sensor; a diode; a keyboard; an input device; a switch; a relay; and a pixel.

In still another aspect of the invention, a process for printing an electrical circuit onto a substrate is provided. The process includes the steps of: a) depositing a plurality of electronic inks onto the substrate; and b) curing each of the plurality of electronic inks. The step of depositing may include the steps of: i) printing a first printable layer by depositing droplets of at least one of the plurality of electronic inks in a first positional pattern onto the substrate; ii) when the previous printable layer has been cured, printing a next printable layer on top of the previously printed layer by depositing droplets of at least one electronic ink in a next positional pattern onto the substrate; and iii) repeating the step of printing a next printable layer on top of the previously printed layer when the previous printable layer has been cured until a last printable layer has been printed. Each of the electronic inks may be deposited using a ink-jet printing process. At least one of the printable layers may be printed using at least two of the plurality of electronic inks.

The electrical circuit may include a plurality of components and a plurality of interconnections between components. Each electronic ink may have at least one electrical characteristic when cured. Each component and each interconnection may be formed by using the at least one electrical characteristic of each cured electronic ink to determine the respective positional pattern of each printable layer. Each of the components and each of the interconnections may be selected from the group consisting of a conductor; a resistor; a capacitor; an inductor; a transistor; a dielectric insulator; a sensor; a diode; a keyboard; an input device; a switch; a relay; and a pixel. Each of the plurality of electronic inks may be selected from the group consisting of a conductive ink; a resistive ink having a resistivity greater than 10,000 ohms per square of printed ink when cured; a resistive ink having a resistivity less than 10,000 ohms per square and greater than 500 ohms per square when cured; a resistive ink having a resistivity less than 500 ohms per square when cured; a high-K dielectric ink having a dielectric constant greater than 50.0 when cured; a low-k dielectric ink having a dielectric constant less than 50.0 when cured; an insulative ink; a ferrite ink; a clear conductive ink; and a semiconductive ink.

Each of the electronic inks may be deposited using a process selected from the group consisting of photolithography, flexography, gravure, and screen printing. For at least one printable layer, each of the electronic inks may be deposited using an ink-jet printing process, and for at least one other printable layer, each of the electronic inks may be deposited using a process selected from the group consisting of photolithography, flexography, gravure, and screen printing.

In yet another aspect, the invention provides a printed circuit board comprising a substrate and an electrical circuit. The circuit includes a plurality of components and a plurality of interconnections between components. Each of the components and interconnections is formed by printing at least one layer of at least one of a plurality of electronic inks onto the substrate in a predetermined pattern and curing the at least one electronic ink. A first layer includes an amount of each of the plurality of electronic inks to be deposited directly upon the substrate according to the predetermined pattern. Each subsequent layer includes at least a minimal amount of each electronic ink to be deposited on top of at least a portion of the previous layer when the previous layer has been cured.

In still another aspect, the invention provides a process for printing at least two electrical components using an ink-jet printing process onto a substrate. The at least two electrical components are selected from the group consisting of conductors; resistors; capacitors; inductors; transistors; dielectric insulators; sensors; diodes; keyboards; input devices; switches; relays; and pixels. At least a portion of each of the at least two electrical components is printed using a single electronic ink. The single electronic ink may be a silver ink.

BRIEF DESCRIPTION OF THE DRAWINGS

FIG. 3 is an illustration of an exemplary ink-jet printing process of multi-layer printing of the electrical circuit of FIG. 2, according to a preferred embodiment of the invention.

DETAILED DESCRIPTION OF THE INVENTION

Digital printing of electronics using ink jet technology can enable the low cost production of circuits that today use expensive photolithography process. With ink jet printing, it will be possible to dramatically change the layout and construction method of these electronic circuits and also optimize materials usage by designing a new method and architecture for use of these electronic inks/materials.

Figure 1:
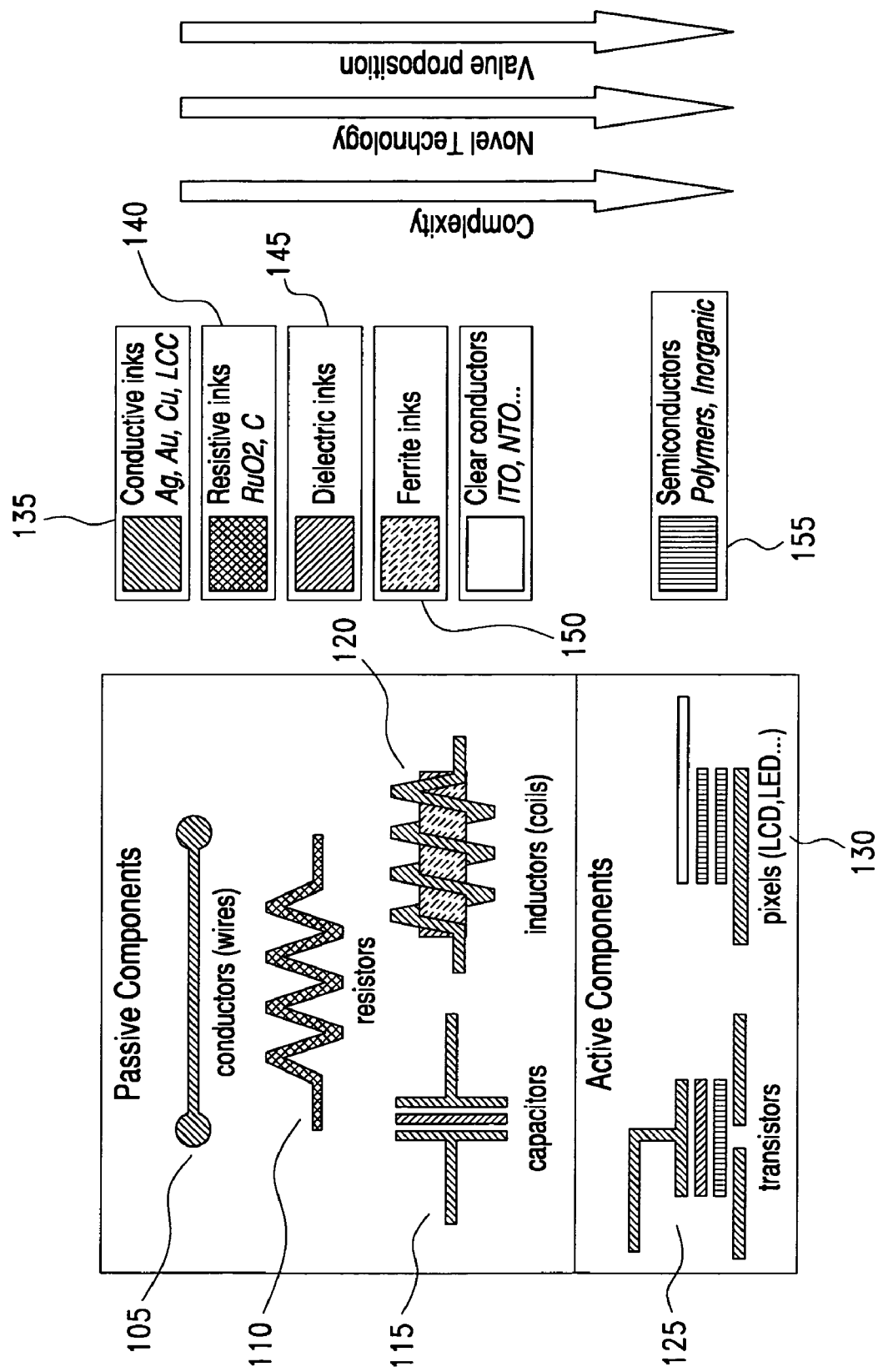
FIG. 1 is an illustration of electrical components that can be fabricated by using a technique of multi-layer printing of electronic inks onto a substrate, according to a preferred embodiment of the invention.

Referring to FIG. 1, the basic electronic components and materials that are used in producing printed circuit boards according to the present invention are illustrated. Passive components include a conductor 105 (i.e., a wire), a resistor 110, a capacitor 115, and an inductor 120. Active components include a transistor 125 and a pixel 130. Each of the passive components can be made using at least one out of five types of electronic inks: a conductive ink 135; a resistive ink 140; a dielectric ink or insulative ink 145; a ferrite ink 150; and a semiconductor ink 155. Insulative ink 145 may also be used as a base support material for the ink jet materials printed on top of it in subsequent layers. For this reason, the insulative ink 145 should be selected such that its adhesion strength and its coefficient of thermal expansion provide stability and compatibility with the other inks to be used in the circuit.

It is noted that although digital ink jet printing is the preferred embodiment of the invention because of the expectation that digital ink jet printing will be most economical for most implementations, the present invention may be implemented using a variety of techniques for printing electronic inks onto a substrate. These alternative printing techniques include photolithography, flexography, gravure, and screen printing. Alternative digital printing techniques, such as laser image transfer imaging (LITI), ablation, xerography, and other digital patterning methods, may be also be used for deposition of the electronic inks.

Unlike conventional discrete components, a layer of printed electronic inks can share materials between device types and interconnections. For example, the first printed conductive layer may also contain the base layer of a capacitor and the source and drain for a transistor. As a result, the interconnect and device components may all be printed within the same layer. This stands in contrast to traditional electronics, in which separate devices are generally fabricated separately with different materials.

A library that includes each of the electronic inks to be used for the circuit is constructed. The library interacts with computer-aided engineering (CAE) software that includes programs that are designed to select available component types based on the electronic inks available, the specified layer, and the sequence of inks. Alternatively, the CAE software could be provided a designed electrical circuit as an input, and then the software would specify the sequence of inks and layers based on the designed circuit.

It is noted that the same ink may be printed several times in different layers. For example, there may be several interconnect layers, or several layers of embedded passive components. In addition, if an ink jet printing system having multiple print heads is being used for deposition of the electronic inks, it is possible to print multiple electronic inks in a single pass (i.e., a single layer). For optimal system performance, the CAE software will be programmed in accordance with these system capabilities.

Resistors

For most printed circuit boards, the resistance of most resistors falls into the range of 1-500 k ohms. Thus, the range of likely resistance values covers six orders of magnitude. A single resistive ink 135 could be used to make all of these resistors, but this would require very large and long resistor layouts to print the high-ohm resistors. A preferred method for fabricating resistors is to print multiple resistive inks. For example, a three-ink system may be optimal; however, any number of resistive inks may be used. In general, for each additional electronic ink used, there are additional processing costs, due to the need for additional printing stations, additional ink jet printing heads, and added complexity to the circuit layout. Therefore, in an exemplary embodiment, a three-ink system for making resistors includes a first resistive ink having a low resistance of less than 500 ohms per square of printed ink (e.g., 5 ohms per square), a second resistive ink having a medium resistance of between 500 and 10,000 ohms per square of printed ink (e.g., 1000 ohms per square), and a third resistive ink having a high resistance of greater than 10,000 ohms per square of printed ink (e.g., 100,000 ohms per square).

Multiple methods for printing resistors may be used according to the present invention. In a first method, a single ink can be used for an individual resistor. With this method, it is possible to print the entire resistor in one pass of the ink jet printer. However, the length and cross-sectional area of the resistor may need to be longer or larger when using this method, in order to achieve the target resistance value.

In a second method, a plurality of inks may be used in a "wet on dry", multi-pass technique. To execute this method, a pattern of two or more inks is determined based on the respective resistivities of the inks and the target resistance value. After each pass of the ink-jet printer, it is required to dry the deposited ink layer prior to deposition of the next layer of ink. In this manner, a "wet" layer of ink is deposited on top of a "dry" layer of ink. When using conventional printing technologies such as photolithography, flexography, gravure, or screen printing, this method can be implemented by using a dryer in between each single color print station.

A third method involves wet-on-wet deposition of two or more electronic inks. Wet-on-wet deposition may involve inks that blend together. In this method, a plurality of inks are selected such that when blended in a predetermined proportion, the resistivity of the blended ink is optimized, based on the target resistance value and a desired dimensional layout of the ink upon the substrate. For this method, the inks may be deposited in a single pass, with a wet ink being printed on top of another wet ink that was deposited moments earlier. This may be achieved in an ink jet printing system having multiple print heads by loading the different inks into different print heads. Alternatively, for conventional printing systems, the order of the color presses may be set up to produce the desired order of ink deposition, with drying to be performed in a separate step following the print pass. Alternatively, wet-on-wet deposition may involve two inks that do not blend together. For example, one ink may be a water-based ink, and the other ink may be an oil-based ink. As another example, one ink may be a hydrophilic ink and the other may be a hydrophobic ink. When non-blending inks are used, the effect is similar to that of wet-on-dry deposition, because although the first ink is not cured prior to deposition of the second ink, the two inks eventually cure without blending together, thus resulting in two separate layers of ink.

Conductors

In many cases, only one conductive ink will be used. However, there are some situations in which multiple conductive inks may be desirable. The primary function of the conductive ink is to provide interconnections between components; i.e., wires. However, conductive ink may also be used as a barrier layer, a device interface/work function, or for solderability, adhesion, or optical characteristics.

Silver ink is an excellent conductor, although this ink may damage some components devised by electro-migration or diffusion. Therefore, to provide a barrier layer, a conductor such as nickel ink may be desirable. The barrier layer would be printed between the electrical component and the highly conductive silver ink. Barrier layers may also find application in solar cells, for example, between the silicon ink and the silver ink; or in active matrix flat panel displays, for protecting the TFT transistors; and in printed organic semiconductors, for both displays and low-cost electronics such as radio frequency identification (RFID) devices. Other types of conductive inks, such as palladium ink, may be used in either a precursor form or in particulate form. It is also possible to print a precursor or particulate ink that forms a silicide to act as a barrier layer instead of printing a completely impermeable layer.

Re the device interface/work function, some devices may require that the conductive pads that form an interface with the device have a certain work function or other characteristic optimized for that device. For example, capacitors may have improved performance if the conductive layers are nickel, palladium, or nickel tantalum. Semiconductors are especially sensitive to this type of material where work function matching can improve device performance and e-migration can be a critical issue.

In some circumstances, a special additional conductive ink material may be needed to perform a mechanical, adhesive, optical, or abrasion resistance function. For example, silver is not an especially good soldering surface, so nick ink may be printed on the pads where soldering is needed in order to make the pad receptive to solder. In addition, it may be possible to create a printable solder which may be printed on the pads prior to attaching the electrical component. Also, some applications in displays and lighting have optical requirements of the conductive lines, in addition to the electrical requirements. For example, in the front glass of a PDP display, the conductive lines need to be black to avoid reflection. Therefore, a printable conductive black ink is needed against the glass as the first layer, prior to deposition of the highly conductive and reflective silver ink. The opposite is true for a light-emitting diode (LED) and some displays like OLED, where the conductive pad behind the pixel or OLED may provide a light gathering function by being reflective and transmitting light forwardly. Transparent conductive inks, such as ITO, may also be used on the front glass of displays together with highly conductive silver ink or other metal inks to increase current-carrying capability. Abrasion resistance is a useful quality, for example, for a keyboard application. A keyboard application typically requires repeated contacts between the key and a pad, thus tending to cause abrasion, especially for relatively thin layers of ink. Therefore, abrasion resistance may be required for long-term performance quality.

Additional examples of conductive inks include the following: 1) Silver/palladium inks, silver/nickel inks, or silver/nickel/palladium inks in which silver nanoparticles and either palladium nanoparticles or nickel nanoparticles or both are supplied in a desired ratio and mixed together with the other ink ingredients to form the ink; 2) silver/palladium inks, silver/nickel inks, or silver/nickel/palladium inks in which silver and either palladium or nickel or both are alloyed to form silver/palladium nanoparticles, silver/nickel nanoparticles, or silver/nickel/palladium nanoparticles; 3) silver/palladium inks, silver/nickel inks, or silver/nickel/palladium inks in which silver and either palladium or nickel or both form a nanocomposite (i.e., not alloyed); 4) silver/palladium inks, silver/nickel inks, or silver/nickel/palladium inks in which silver nanoparticles and either a palladium molecular precursor or a nickel molecular precursor or both are mixed together; and 5) silver/palladium inks or silver/nickel inks in which a silver precursor and either palladium nanoparticles or nickel nanoparticles or both are mixed together. For the formation of a metal silicide barrier layer, for example in a transistor, palladium and nickel are especially advantageous because the formation of palladium silicide or nickel silicide can occur at low temperature. When nickel or palladium is mixed into the conductive ink, either in nanoparticulate form (metal or alloy) or in molecular precursor form, each can form a barrier interface layer when deposited onto silicon and cured at low temperature. Another example of a conductive ink having a relatively high work function is an ink that includes silver nanoparticles that are coated with a conductive polymer, such as poly(3,4-ethylene) dioxythiophene (PEDOT).

Dielectrics and Insulators

Dielectric inks are used to print internal, non-conductive layers in passive and active electronic devices. When cured, these inks have varying dielectric constants and interfaces which make them behave uniquely in different devices. It is therefore possible that multiple dielectric inks may be needed, especially where high performance active devices, such as transistors, are being printed. Dielectric inks are also used to form a critical layer in capacitors. Dielectrics, by nature, are insulative, as opposed to conductive; therefore, in some printing systems, if a minimal number of layers or inks is desired, a dielectric ink may be used as both the dielectric layer and the insulative layer. In other cases, where two separate inks can be used, it is likely that passive and active devices will use a very thin layer of a dielectric ink having a relatively high dielectric constant (i.e., a high-K dielectric ink having a dielectric constant greater than 50.0) with low loss, and that a low-K dielectric ink (e.g., an ink having a dielectric constant less than 50.0) printed in thicker, protective layers will be used for insulation functions. For a passive electrical component, performance quality is typically a function of two parameters: 1) the thickness of the ink layer; and 2) the dielectric constant K. In general, for high performance applications, such as a battery tester, an electronic ink having a relatively high dielectric constant and a relatively thin but reliable layer is required. Therefore, two or three dielectric inks may be used together, and the material cost may be relatively high. For low cost applications, in which the printing cost is more important than the performance quality, typically one ink is used.

Ferrite/Magnetic Inks

Ferrites are unique materials that have electromagnetic qualities. They are used as cores in inductors, and they can also be used to prevent electromagnetic interference (EMI) and for noise suppression. Ferrite inks can also be made to be magnetic, e.g., magnetic ink character recognition (MICR), thus providing value as programmable media. For example, this application can be used as the magnetic stripe on the back of a credit card, or for read/write memory. There are situations in which a single ferrite ink may be used, and there are other situations in which more than one ferrite ink may be used as a blended ink or to provide two ferrite inks having different permeabilities when cured. Typically, ferrite inks use iron, nickel, cobalt, and/or alloys of these metals.

Semiconductor Inks

Two broad categories of printable semiconductor inks have been developed and demonstrated. One category includes printable inorganic semiconductors, such as silicon, zinc oxide, and others. These inks are generally either precursor inks (e.g., silanes), nano-particle inks, flakes, or blends of these. The other category includes organic semiconductors, such as pentacine, PPV, and others. These inks may be used to print diodes or bipolar junction transistors, but they are most often used to produce printable metal-oxide-semiconductor field effect transistors (MOSFETs). Three inks are needed to create a MOSFET: a conductive ink, a dielectric ink, and a semiconductor ink. Two layers of conductive ink are needed. Therefore, the architecture of the device generally requires four layers or more. Organic semiconductor inks also may be used to print light emitting diodes, including organic light emitting displays (OLEDs) and polymer light emitting displays (PLEDs). These light-emitting devices may be combined into the printing of a broader electronic circuit using the technology described herein. Most organic semiconductor inks are polymers dissolved in water or another solvent, but particulate inks may also be used. Potential optical applications for semiconductor inks may also include flat panel display devices, such as plasma displays, surface emission displays (SEDs), electroluminescent (EL) devices, electroferritic devices, and electrochromic devices.

Semiconductor inks may generally be described as either inorganic or organic. Examples of inorganic semiconductor inks may include the following:
1) Silicon inks, such as inks containing oligomeric silanes such as heptasilane or octasilane, or cyclosilanes such as cyclopentasilane or cyclohexasilane, and inks containing higher molecular weight silanes such as silanes containing only silicon and hydrogen atoms with the number of silicon atoms being greater than ten.
2) Doped silicon inks, in which a predetermined small amount of dopant precursors are mixed into a silicon ink as described above. The dopant precursor may be, for example, a phosphasilane or a borasilane. These types of precursors are is used to fabricate n-doped or p-doped semiconductor layers, respectively.
3) Germanium inks that contain germanium molecular precursors.
4) Other semiconductor inks can contain precursors to form III-V or II-VI compound semiconductors.
5) Instead of molecular precursors, the semiconductor inks described above in items 1-4 may include the respective nanoparticles, nanorod, or nanowire materials.

Examples of organic semiconductors, including small organic or organometallic molecules and polymeric molecules, which are used in electronic inks include the following:

| Chemical Compound | Abbreviation | Notes | Main appl. |
|---|---|---|---|
| Poly(p-phenylene vinylene) | PPV | PPV derivatives also used to increase solubility and tune band gap | OLEDs |
| Poly(phenylene ethynylene) | PPE | | OLEDs |
| Poly(p-phenylene) | PPP | | OLEDs |
| Poly(alkylated thiophene) | PAT | | FETs |
| Poly(thienylene vinylene) | PTV | | FETs |
| Polyfluorene | PF | | |
| Copolymerized and side chain modified PF | F8T2 | | FETs |
| Pentacene | | | FETs |
| Hexithiophene | 6T | | FETs |
| (tris(8-quinolinolato)aluminum | $Alq_3$ | | |
| Carbon nanotubes | CNT | | |

In general, the number of inks used and the complexity of the sequence of printing are major factors in the cost of the process. There is usually a practical limit, based on hardware, with respect to the number of inks that can be used. For example, many industrial ink jet systems support six-color printing, because there are six ink jet printing heads within the same printing mechanism. Other systems may have four ink jet heads and therefore support four-color printing. All inks can then be printed in a single pass. For traditional printing presses such as those used in photolithography, flexography, and gravure, the use of up to ten color presses is not uncommon. For screen printing, where spot colors may be used for graphics, it is not uncommon for up to 20 different color printing stations to be placed in sequence in a single line. On these systems, it is also typical to set up drying stations within the print engine sequence. For these traditional printing methodologies, infrastructure costs may be determinative of other practical aspects relating to the inks, because equipment costs may be great, especially in the case of gravure. Therefore, compatibility of the inks may be a requirement, and inks may be chosen accordingly.

Despite potential increases in the cost of the process, the use of additional electronic inks provides benefits by improving device performance and functionality within the printed electrical circuit. For example, the use of a high-K dielectric ink enables enhanced performance of capacitors and transistors, whereas a low-K dielectric ink used as an insulator provides better isolation of crosstalk between traces and enhanced encapsulation capabilities. As another example, the use of three separate resistive inks permits smaller positional layouts of resistors and more accurate resistance values over a wider range of possible values, as compared with the use of only one or two resistive inks.

Different printing techniques also provide different advantages and disadvantages. Analog printing techniques, including photolithography, flexography, and gravure, provide the benefits of high speed and efficient use of materials. These techniques are especially useful for high production applications, such as RFID tags. However, these techniques may have difficult material requirements, and because they use relatively expensive equipment, the set-up costs may be relatively high. Screen printing provides the benefits of high solids loading and layer thickness, and may be used on a broader range of materials. In addition, the equipment is less expensive than for photolithography, flexography, or gravure. However, screen printing is generally slower than the three processes mentioned above, and the print resolution is generally lower than for those processes.

Ink jet printing systems and other digital systems provide several advantages. First, the set up costs are minimal. Customized devices can be used. These techniques allow for wet-on-wet printing, to provide a capability to blend inks. Also, multi-pass printing with the same set of materials may be performed. These systems can build up devices in layers. They are non-contact and conformal. With these systems, it is possible to print on non-uniform surfaces or fragile substrates without creating pressure or damaging the substrate material.

Figure 2:
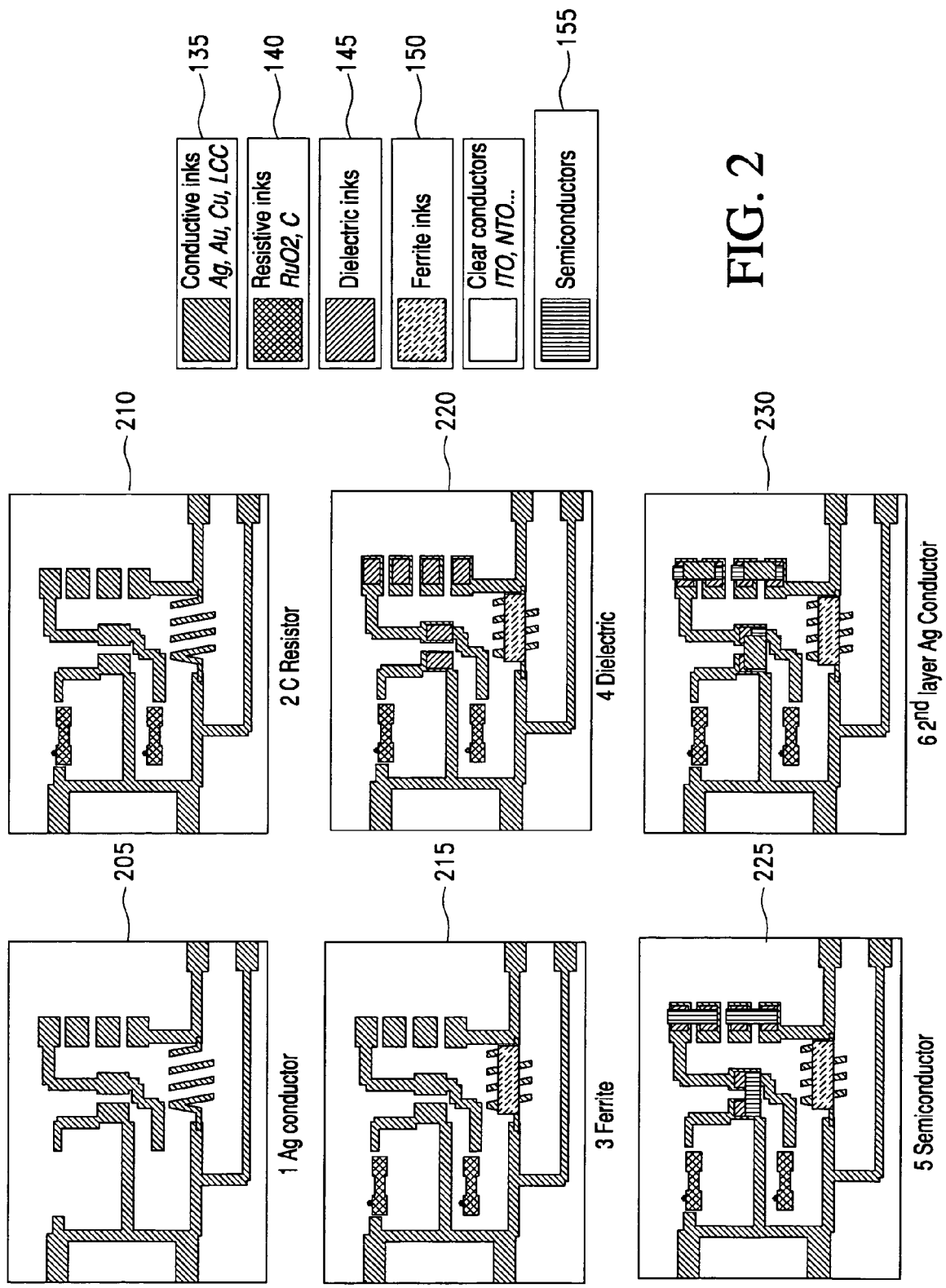
FIG. 2 is an illustration of an exemplary process of multi-layer printing of an electrical circuit onto a substrate using electronic inks, according to an embodiment of the invention.

Referring to FIG. 2, an example of printing an electrical circuit in layers using five separate electronic inks is illustrated. In the first layer 205, a silver ink is used as a conductive ink to print the interconnections between components, a portion of the coil for an inductor, and the source and drain for each of three MOSFET transistors. In a preferred embodiment, drying, or curing, of the ink occurs after each layer is printed, prior to deposition of the next layer; however, wet-on-wet deposition using non-blending inks may also be done. In the second layer 210, a resistive ink is used to print two resistors having precalculated dimensions and predetermined positions on the substrate. In the third layer 215, a ferrite ink is used to print the core for the inductor. In the fourth layer 220, a dielectric ink is used to print portions of each MOSFET. In the fifth layer 225, a semiconductor ink is used to print more portions of each MOSFET. Finally, in the sixth layer 230, the silver conductive ink is again used to print the remaining portions of the MOSFETs and also to complete the coil for the inductor. Thus, an entire electrical circuit has been completed after the sixth layer 230 is printed, including resistors, an inductor, several MOSFETs, and wires for interconnecting the components. Additionally, the use of a single silver conductive ink has been used for interconnections and portions of several components, thus providing a versatility of materials that is not available for conventional printed circuit boards using surface-mounted components and wires.

Referring to FIG. 3, the same circuit produced in FIG. 2 is again illustrated. In this instance, because an ink-jet printing system with at least three print heads is used, the six-layer process of FIG. 2 can be reduced to four layers. In effect, the second, third, and fourth layers 210, 215, 220 from the previous process can be combined into a single second layer 310 in the ink-jet printing process, because the resistive ink, the dielectric ink, and the ferrite ink can be loaded into separate print heads and then all printed in the same pass. The first layer 305, the third layer 315, and the fourth layer 320 correspond to the first layer 205, the fifth layer 225, and the sixth layer 230 of the previous process, respectively.

After the ink is printed onto the substrate, the ink is dried or cured to obtain a solid electronic feature. In some cases, electronic functionality such as electrical conductivity has been observed after simply drying at room temperature. In most cases, a curing step is required to reach the desired electrical properties of the printed material. In the case of a sheet-fed or web-fed printing process, curing can be performed in line. In-line curing can be performed after each printing step, or curing can be performed after two or more printing steps are completed. The latter is sometimes referred to as co-firing. In the case of sheet-fed printing equipment, curing can also be performed as a batch process, which often means that the sheet substrate is removed from the printing system and cured at a different location, usually together with several other sheets. When performed together with several other sheets, the process is sometimes referred to as batch processing, batch curing, or cassette processing or curing.

Curing means that energy is delivered to the printed layer in one of various possible forms, including the following:
1) Heat, for example as conductive heat using a hot plate or oven, convective heat, for example using a convection oven, hot gas flow, or blow dryer;
2) Radiation, i.e., infrared radiation, ultraviolet radiation, visible light, microwave, radio frequency (RF) radiation, etc., using a conventional source or laser source. Rapid thermal processing (RTP) is a form of radiation curing, typically a flash exposure of infrared energy;
3) Chemical energy, such as the use of a reducing agent;
4) Inductive heating;
5) Ultrasonic vibration; and
6) Friction.

Three approaches may be taken to create an ink-jet printing system that is capable of producing electronics. It is not cost effective to assume that the ink-jet printing system hardware configuration can be redesigned for each circuit design. Thus, the invention provides a general purpose ink-jet printing system and a standard set of electronic inks, together with a fixed or programmable ink printing pattern that can be easily configured without changes to the ink-jet printing system hardware. The invention also provides the ability to use a flexography or gravure system having multiple printing presses instead of an ink-jet printing system.

In one embodiment, a multi-color ink-jet printing system with a fixed number of print heads and a fixed set of electronic inks is provided. Such a system has separate ink reservoirs and ink-jet printing heads for each electronic ink. All inks may be printed in a single pass of the print head. In addition, multi-pass printing can be performed with this system. The sequence in which the inks are printed in a single pass is a function of the sequence in which the print heads for each ink are placed into the ink-jet printer hardware. Because one print head will pass over the substrate first, followed by the second print head and so on, the sequence of the deposition of electronic inks will correspond to the printer hardware configuration. A modified graphics ink-jet printer using new electronic inks and software can be used for this application. Many of these systems will also include a drying system to cure the deposited inks on the substrate. It is also possible that an external drying station would be required. If multiple circuit layers are used, then the printed circuit may require removal, curing, and reinsertion for printing of additional layers. In this manner, very high layer density circuits may be printed. In an alternative embodiment, a flexography or gravure system having multiple printing presses may be used instead of an ink-jet printing system. Each press deposits a layer of ink onto the substrate.

In an alternative embodiment, a sequence of monochrome ink-jet printing systems (i.e., each printer station using only one electronic ink) may be employed. Such a configuration may be useful for high production systems, high accuracy circuits, or specialized displays. This configuration will likely use drying stations between each printer station, and each drying station will generally employ a form of automated materials handling. Laminations may also be performed at selected points in the process. In an alternative embodiment, a flexography or gravure system having multiple printing presses may be employed instead of a sequence of ink-jet printing systems.

A hybrid approach may also be employed. For example, a high-resolution photolithography step may be used first, followed by a six-color ink-jet printing system, then a screen printing for a protective layer, and then traditional component insertion and soldering may also be used. The circuit designer simply picks and chooses from the various technologies to achieve an optimal electrical circuit.

In designing the layout of electronic inks, the hardware configuration of the electrical circuit must be known. In addition, knowledge of the electrical characteristics of the available electronic inks and knowledge of the performance ranges that can be created are important in determining the positional layout of the inks. It is also possible to use bi-directional printing, in which the printer first prints in the forward direction by passage of the print head across the substrate, and then the printer prints in the reverse direction by return of the print head across the substrate to the starting point. The use of bi-directional printing may also impact the instructions provided (e.g., the software commands) for the positional layout of the electronic inks on the substrate.

Each time that the ink-jet printing system passes over the substrate, it is possible to print all of the electronic inks at any location on the substrate. Software can be used to optimize the layout and print passes. However, depending on whether wet-on-wet deposition of inks is being performed, or if the desired electronic or display device has a more complex multi-layer architecture, the layout software must specify the number of layers and the curing steps required to build the circuit. For example, construction of a capacitor may require three print layers.

Generally, a substrate material, such as FR4, Kapton, or paper, will be used. It is possible that while a circuit is being built up by printing of layers, the surface will become no longer level. Thus, filler materials may be used to level each circuit layer. This material may be a polymer or other insulating material that offers a good printing surface, structural integrity, and interlayer bond strength. Software can be used to calculate the required volumes of filler material needed for leveling each circuit layer.

Vias are typically used for enabling circuit traces to pass from one layer to the next. Vias are generally circular. It is possible that a circular hole can be left by printing the insulating layer everywhere except the via location; however, this is difficult due to "dot gain", i.e., the tendency of the ink to spread out slightly from its deposition location. Thus, it may be more effective to use a via ink. The via ink is generally hydrophobic to the insulative ink. The via ink creates a place holder for the via contact between layers. It is possible that the via ink can be a conductive ink; alternatively, it may be merely compatible with the conductive ink so that, when the conductor is printed on top of the via, the conductor is able to make contact with the layer below.

In a conventional printed circuit board, because lamination is used, the entire layer is covered with the insulating material. However, for the ink-jet printing system, it is possible to only cover the areas of the conductors and the devices needed to run the next layer of conductors. In this way, less insulation is used, and greater circuit density with less layers may be possible.

At least two types of repair applications may be performed using an ink-jet printing system according to an embodiment of the present invention. Using optical recognition, flaws in the circuit manufacture may be found. Such flaws may include mouse bites, short circuits, open circuits, or incorrect resistance values. Such flaws may be corrected through selective ink-jet printing over the flawed portions of the circuit. Another type of repair application is to repair flaws in the circuit design. "Cuts" and "jumpers" may be ink-jet printed directly onto finished circuit boards. Because ink-jet printing is non-contact and may be performed at a distance from the substrate, it is possible to print onto finished printed circuit boards despite the presence of components and solder bumps, which would generally create major obstacles for other printing technologies.

Another possible application, according to an embodiment of the present invention, is to merge conventional surface mounting of components onto the substrate with ink-jet printing onto the substrate. Both sides of the substrate may be used. In order to have two sided component placement, it is necessary to have contacts established on the back side of the printed board. This can be accomplished with traditional drilled via holes through the substrate. Then, the board can be flipped and printed on the back side. The interconnect material in the vias can be provided through hole plating, either conventionally or using ink-jet printing. After the base board has been completed, multi-layer printing of the circuits may be done on both sides of the substrate. This may be desirable for greater circuit complexity or for greater structural integrity. For simpler circuits, it may be desirable to have all of the printing and components on one side of the printed board.

In another embodiment, integrated circuit dies and traditional components may be mounted on the substrate prior to printing. Using an alignment system, the interconnections can be printed directly onto the pads of these devices. In this embodiment, the pads must be on the top sides of the components, i.e., exposed to the printing, and it is desirable to use a tapered ramp or transition material to reduce the vertical transition for the printed electronic ink. This application is similar to a conventional wire bonding application for surface mount technology.

Alternatively, the board can be printed first, and then surface mounting of integrated circuit dies and traditional components can be performed. In this embodiment, soldering or a conductive adhesive will generally be used. It is possible for the ink-jet printer to deposit the solder or conductive adhesive in preparation for component insertion.

For certain types of applications, gravure or flexography are preferred as opposed to ink-jet printing. However, the development of gravure, flexography, and offset lithographic inks and related printing and processing technology for printing of electronics on paper-like substrates poses considerable technical barriers. These barriers can be categorized into four technology development areas: nanoscale dispersions; ink formulation technology; printing parameters and ink rheology optimization; and circuit layout design and multilayer printing.

Nanoscale dispersions: The lithographically printed film thickness for a single-hit print on an industrial-scale offset press is typically in the 1 µm range. Such thin deposits make it extremely challenging to obtain reliable performance using a conventional flake and resin approach. The lack of performance reliability associated with mechanical contact between flake particles is exacerbated in such thin deposits printed on highly flexible and moisture sensitive substrates such as paper. Hence, a new approach will be required for creating more robust and more conductive electrical percolation networks. The present invention discloses that conductor nano-technology provides a solution to this problem.

Lithographic ink formulation technology: To the best of our knowledge, nano-engineered lithographic ink formulations compatible with industrial-scale offset press printing have not been developed or disclosed in the scientific or patent literature. U.S. Pat. No. 6,356,234 and U.K. Patent Application No. 9612272.6 by Harrison et al. disclose electronic circuits printed by an offset lithographic method. However, this patent discloses the use of traditional 5-µm Ag flake dispersed in a resin, and lithographic printing performed on a lab scale press. It has been well documented that traditional flake based suspensions are not compatible with industrial scale lithographic offset printing, which has very stringent ink rheology requirements. In addition to improved electronic particle morphology, two other critical barriers exist today that hamper the development of industrial lithographic and gravure inks: the ability to print thicker layers and to form dense single-phase percolation networks. Thicker printed layers hinge on the ability to formulate nanoparticle dispersions and mixtures of nanoparticles and microparticles with high solid loading and a viscosity in the range of several hundred to several thousand centipoise. The ability to print a layer with a thickness of several µm in a single hit would dramatically improve performance, reliability, and cost of electronics printed on commercial graphic presses. Dense single-phase deposits remain elusive for low temperature processes. The particle capping agents and liquid ink components available today only allow weak mechanical contact between particles after curing. The nanoparticle based ink formulations of the present invention can resolve these problems.

Printing parameters and ink rheology optimization: Electronic inks have very high loading of heavy metal particles which are about three to ten times as dense as many pigment particles and have surface functional groups that are far less robust as compared to color pigments. This is likely to result in inks which behave similar to pigment lithography inks in a high shear environment, but are too flowable in a low shear regime due to the high density of the particles and limited interaction with bulky polymers. This may compromise edge definition and the overall quality of the printed films.

In traditional graphics offset printing, a typical film layer will be 0.5 to 1.5 μm and this thickness can be adjusted mechanically on the press by feeding the plate more ink by changing the gap at the roller nip points. The amount of ink deposited is also related to solids content and rheology. All these parameters are interrelated in a complex way. Standard inks for sheet-fed offset printing may be dried and cured by a variety of methods. These include forced hot air, infra-red (IR) lamp, ultraviolet (UV) lamp, electron beam (EB), and cooling. These techniques are traditionally employed to drive off excess solvent by evaporation and to induce crosslinking of the ink resin in a very short period of time.

Circuit layout design and multi-layer printing: The starting point for designing electronic circuits for applications such as printed RFID's using offset printing should be a component library (printed interconnects, resistors, capacitors) and a set of design rules. This requires a basic understanding of device performance values and achievable tolerances over the length of a print run, across the width of a sheet, and from the leading to the trailing edge of a sheet. This database must be developed. The ability to print insulating "overpasses" will enable printing of multilayer circuits, while printing of a conductor-insulator-conductor stack will enable printed capacitors. To enable this type of complex device printing in a single pass, ink trapping considerations will need to be designed into the inks.

Proposed Solutions: Nanoscale dispersions—Current electronic ink development is largely focused on rheology and performance improvements to an ink system that is based on dispersions of electronic particles in a polymer matrix resin. However, this approach suffers from inherent lack of performance reliability associated with weak interactions between individual particles. The present invention describes an innovative approach that will create more conductive electrical percolation networks that will be more robust and more reliable. It has been known for some time that metal nanoparticles have reduced melting and sintering temperatures when compared to their microparticle counterparts. This attribute is exploited in the present invention to obtain solid-metal-like performance with low temperature processing, by the use of metal nanoparticles with customized surface capping and surface functionalization, and carbon nanoclusters with metal surface functionalization. It can be appreciated that the particle size distribution of these nanoparticle ink formulations is less stringent as compared to ink-jet ink formulations, for example 10-50 nm particles can be mixed with 50-500 nm particles in various ratios. Alternatively, a 10 nm to 200 nm particle size distribution may be adequate for various flexography, gravure, and offset ink formulations. Also, the higher viscosity of these inks (i.e., 100 to 50,000 centipoise), as compared to ink-jet ink formulations, allows higher loadings of nanoparticles, which can have a positive impact on dispersion stability over time.

Lithographic ink formulation technology: The present invention describes three critical factors for the development of industrial lithographic inks: electronic particles with improved morphology and particle size distributions that are adequate for inks that can be flexographically and gravure printed, the ability to print sufficiently thick layers, and the ability to form dense electrical percolation networks at low temperatures.

Printing parameters and ink rheology optimization: Ink viscosity can be controlled under variable shear conditions to improve edge definition and the overall quality of the printed films. Nanoparticle surface chemistry and the use of core-shell structured nanoparticles can be utilized to tune ink rheology. Also, the use of less dense conductive particles, such as graphitic carbons with metallic surface functionality, which would behave more like typical pigments, will allow control of ink rheology.

Post processing technology can be utilized, including standard thermal processes such as forced hot air and IR drying at high throughput to induce full drying and curing of the electronic nanoparticle inks. If this approach does not yield adequate performance, a slower run condition can allow a longer dwell at temperature. Alternatively, it may be necessary to do a post-bake on a stack of substrates. Variations of stack curing procedures at elevated temperatures and under controlled ambients can be utilized to improve electrical performance of the prints.

Circuit layout design and multilayer printing: In order to reliably print insulating "overpasses", conductor-insulator-conductor stacks, conductor-resistor contacts, etc., trapping properties can be designed into ink sets for overprinting in a single pass. To accomplish this, the rheology of the inks can be adjusted so that the tack numbers of inks decrease in the order they are printing. This can promote efficient ink trapping and minimized back trapping during an overprint pass.

While the present invention has been described with respect to what is presently considered to be the preferred embodiment, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A printed electronic device comprising:
a substrate; and
an electrical circuit formed on the substrate, the circuit comprising at least one layer of at least one of a plurality of electronic inks ink-jet printed directly onto the substrate in a predetermined pattern and cured to form a silicide barrier layer, and at least a second layer of at least a second of the plurality of electronic inks deposited upon at least a portion of the at least one layer and cured to form a conductive layer.

2. A process for printing the printed electronic device of claim 1, the process comprising:
printing in a non-vacuum the at least one layer by directly depositing droplets of at the least one of a plurality of electronic inks in a first positional pattern onto the substrate;

curing the at least one layer to form the silicide barrier layer;

printing the at least a second layer by depositing the at least a second of the electronic inks in a next positional pattern onto at least a portion of the silicide barrier layer; and curing the at least a second layer to form the conductive layer.

3. The process of claim 2, wherein each of the electronic inks is directly deposited using ink-jet printing.

4. The process of claim 3, wherein at least one of the printable layers is printed using at least two of the plurality of electronic inks.

5. The process of claim 2, the electrical device including a plurality of components and a plurality of interconnections between components.

6. The process of claim 5, wherein each of the plurality of components and each of the plurality of interconnections is selected from the group consisting of a conductor; a resistor; a capacitor; an inductor; a transistor; a dielectric insulator; a sensor; a diode; a keyboard; an input device; a switch; a relay; and a pixel.

7. The device of claim 1, wherein each of the plurality of electronic inks is selected from the group consisting of a conductive ink; a resistive ink having a resistivity greater than 10,000 ohms per square of printed ink when cured; a resistive ink having a resistivity less than 10,000 ohms per square of printed ink and greater than 500 ohms per square of printed ink when cured; a resistive ink having a resistivity less than 500 ohms per square of printed ink when cured; a high-K dielectric ink having a dielectric constant greater than 50.0 when cured; a low-k dielectric ink having a dielectric constant less than 50.0 when cured; an insulative ink; a ferrite ink; a clear conductive ink; and a semiconductive ink.

8. The device of claim 1, wherein at least one of the electronic inks is deposited using a process selected from the group consisting of photolithography, flexography, gravure, and screen printing.

9. The device of claim 1, wherein for at least one printable layer, each of the electronic inks is deposited using ink-jet printing, and for at least one other printable layer, each of the electronic inks is deposited using a process selected from the group consisting of photolithography, flexography, gravure, and screen printing.

10. The process of claim 2, further comprising:
printing and curing a next printable layer a number of times.

11. The process of claim 2, wherein the silicide barrier layer comprises nickel silicide and the conductive layer comprises silver.

12. The process of claim 2, the electrical device being part of a solar cell.

13. The device of claim 1, wherein the silicide barrier layer comprises nickel silicide and the conductive layer comprises silver.

14. The device of claim 1, wherein the device is a solar cell.

15. The device of claim 1, wherein each of the electronic inks is directly deposited using ink-jet printing.

16. The device of claim 1, wherein at least one of the silicide barrier or conductive layers comprises at least two of the plurality of electronic inks.

17. The device of claim 1, the electrical circuit including a plurality of components and a plurality of interconnections between components.

18. The device of claim 1, wherein each of the plurality of components and each of the plurality of interconnections is selected from the group consisting of a conductor; a resistor; a capacitor; an inductor; a transistor; a dielectric insulator; a sensor; a diode; a keyboard; an input device; a switch; a relay; and a pixel.

19. The device of claim 1, wherein each of the plurality of electronic inks is selected from the group consisting of a conductive ink; a resistive ink having a resistivity greater than 10,000 ohms per square of printed ink when cured; a resistive ink having a resistivity less than 10,000 ohms per square of printed ink and greater than 500 ohms per square of printed ink when cured; a resistive ink having a resistivity less than 500 ohms per square of printed ink when cured; a high-K dielectric ink having a dielectric constant greater than 50.0 when cured; a low-k dielectric ink having a dielectric constant less than 50.0 when cured; an insulative ink; a ferrite ink; a clear conductive ink; and a semiconductive ink.

20. The device of claim 1, wherein at least one of the electronic inks is deposited using a process selected from the group consisting of photolithography, flexography, gravure, and screen printing.

21. The device of claim 1, wherein for at least one printable layer, each of the electronic inks is deposited using ink-jet printing, and for at least one other printable layer, each of the electronic inks is deposited using a process selected from the group consisting of photolithography, flexography, gravure, and screen printing.

22. The device of claim 21, wherein the silicide barrier layer comprises nickel silicide and the conductive layer comprises silver.

23. The device of claim 1, the device being part of a solar cell.

24. A solar cell device comprising:
a substrate; and
an electrical circuit formed on the substrate, the circuit comprising a first layer of electronic ink ink-jet printed directly onto the substrate and cured to form a silicide barrier layer, and at least a second layer of electronic ink deposited upon at least a portion of the silicide barrier layer and cured to form a conductive layer.

25. The device of claim 24, wherein the silicide barrier layer comprises nickel silicide and the conductive layer comprises silver.

26. The device of claim 24, wherein at least one of the first and second layers includes multiple electronic inks.

* * * * *